(12) United States Patent
Matsuzaki

(10) Patent No.: US 10,944,396 B2
(45) Date of Patent: Mar. 9, 2021

(54) SEMICONDUCTOR DEVICE AND METHOD FOR DRIVING THE SEMICONDUCTOR DEVICE

(71) Applicant: Semiconductor Energy Laboratory Co., Ltd., Atsugi (JP)

(72) Inventor: Takanori Matsuzaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/486,184

(22) PCT Filed: Feb. 20, 2018

(86) PCT No.: PCT/IB2018/051015
§ 371 (c)(1),
(2) Date: Aug. 15, 2019

(87) PCT Pub. No.: WO2018/158650
PCT Pub. Date: Sep. 7, 2018

(65) Prior Publication Data
US 2020/0235733 A1 Jul. 23, 2020

(30) Foreign Application Priority Data
Mar. 3, 2017 (JP) .............................. JP2017-040312

(51) Int. Cl.
*H03K 17/687* (2006.01)
*H02M 3/07* (2006.01)
(Continued)

(52) U.S. Cl.
CPC .......... *H03K 17/6871* (2013.01); *H02M 3/07* (2013.01); *G11C 11/412* (2013.01); *H01L 29/7869* (2013.01); *H02M 2003/071* (2013.01)

(58) Field of Classification Search
CPC ... H03K 17/678; H03K 17/6781; H02M 3/00; H02M 3/02; H02M 3/04; H02M 3/06;
(Continued)

(56) References Cited

U.S. PATENT DOCUMENTS 5,251,153 A 10/1993 Nielsen et al.
6,069,518 A 5/2000 Nakai et al.
(Continued)

FOREIGN PATENT DOCUMENTS

| JP | 07-231647 A | 8/1995 |
| JP | 11-150230 A | 6/1999 |
| JP | 2012-239166 A | 12/2012 |

OTHER PUBLICATIONS

International Search Report (Application No. PCT/IB2018/051015) dated May 29, 2018.
(Continued)

*Primary Examiner* — Diana J. Cheng
(74) *Attorney, Agent, or Firm* — Robinson Intellectual Property Law Office; Eric J. Robinson

(57) ABSTRACT

To provide a semiconductor device that generates a stable negative potential with high accuracy and achieves lower power consumption. The semiconductor device includes a voltage conversion circuit, a comparator, a logic circuit, a transistor, and a capacitor. The voltage conversion circuit has a function of outputting, as a second signal, a signal obtained by conversion of a voltage of an input first signal in response to a clock signal output from the logic circuit. The comparator has a function of being controlled to be supplied with or not supplied with a power supply voltage in response to a power gating signal. The transistor has a function of holding an output voltage of the comparator in the capacitor in a period during which the transistor is in an off state. The logic circuit has a function of switching between supply and stop of the clock signal on the basis of (Continued)

the voltage held in the capacitor in a period during which the power supply voltage to the comparator is stopped.

6 Claims, 17 Drawing Sheets

(51) Int. Cl.
*G11C 11/412* (2006.01)
*H01L 29/786* (2006.01)

(58) Field of Classification Search
CPC .. H02M 3/07; H02M 3/073; H02M 2003/071; H02M 2003/072; H02M 2003/075; H02M 2003/076; H02M 2003/077; H02M 2003/078; G11C 11/41; G11C 11/412; H01L 29/7869
See application file for complete search history.

(56) References Cited

U.S. PATENT DOCUMENTS

| | | | |
|---|---|---|---|
| 6,204,721 B1 | 3/2001 | Yuen et al. | |
| 6,229,379 B1 | 5/2001 | Okamoto | |
| 6,337,593 B1 | 1/2002 | Mizuno et al. | |
| 7,889,477 B2 * | 2/2011 | Neubarth | H02M 3/3384 |
| | | | 361/212 |
| 8,737,109 B2 | 5/2014 | Yamazaki et al. | |
| 8,947,158 B2 | 2/2015 | Watanabe | |
| 9,385,592 B2 | 7/2016 | Watanabe et al. | |
| 9,501,119 B2 | 11/2016 | Watanabe | |
| 9,614,094 B2 | 4/2017 | Watanabe | |
| 9,825,526 B2 | 11/2017 | Watanabe | |
| 9,847,406 B2 | 12/2017 | Miyairi et al. | |
| 2012/0051118 A1 | 3/2012 | Yamazaki et al. | |
| 2012/0274401 A1 | 11/2012 | Watanabe | |
| 2013/0241515 A1 | 9/2013 | Yamashiro et al. | |
| 2016/0094236 A1 | 3/2016 | Shionoiri et al. | |
| 2017/0179294 A1 | 6/2017 | Kato et al. | |
| 2017/0186473 A1 | 6/2017 | Ikeda et al. | |
| 2017/0186749 A1 | 6/2017 | Ohshima et al. | |
| 2017/0229486 A1 | 8/2017 | Matsuda et al. | |
| 2017/0230041 A1 | 8/2017 | Kato et al. | |
| 2017/0302271 A1 | 10/2017 | Kato et al. | |

OTHER PUBLICATIONS

Written Opinion (Application No. PCT/IB2018/051015) dated May 29, 2018.
Tamura.H et al., "Embedded SRAM and Cortex-M0 Core Using a 60-nm Crystalline Oxide Semiconductor", IEEE Micro, Nov. 1, 2014, vol. 34, No. 6, pp. 42-53.

* cited by examiner

FIG. 15A
- (ST71) completion of element substrate
- (ST72) dicing
- (ST73) die bonding
- (ST74) wire bonding
- (ST75) molding
- (ST76) plating and processing lead
- (ST77) marking
- (ST78) inspection
- (ST79) completion
FIG. 15B
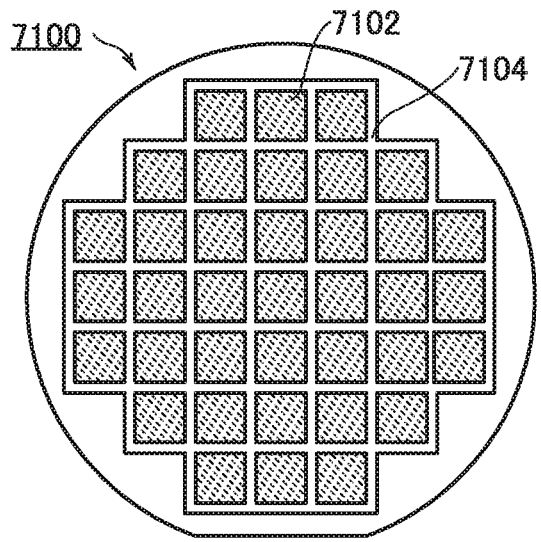
FIG. 15C
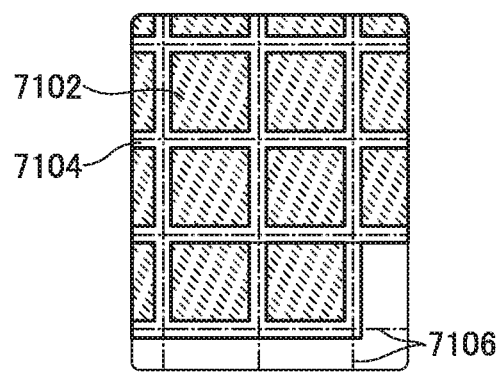
FIG. 15D
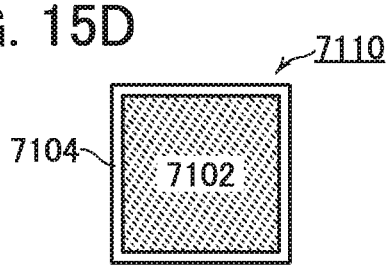
FIG. 15E
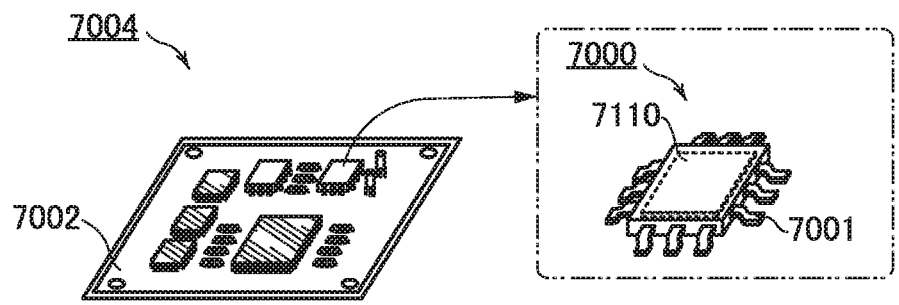

SEMICONDUCTOR DEVICE AND METHOD FOR DRIVING THE SEMICONDUCTOR DEVICE

TECHNICAL FIELD

One embodiment of the present invention relates to a semiconductor device and a method for driving the semiconductor device.

In this specification and the like, a semiconductor device refers to a device that utilizes semiconductor characteristics, and means a circuit including a semiconductor element (a transistor, a diode, and the like), a device including the circuit, and the like. The semiconductor device also means all devices that can function by utilizing semiconductor characteristics. For example, an integrated circuit and a chip including an integrated circuit are examples of semiconductor devices. Moreover, a memory device, a display device, a light-emitting device, a lighting device, an electronic device, and the like themselves are semiconductor devices in some cases, or include a semiconductor device in some cases.

BACKGROUND ART

A transistor including a metal oxide in a channel formation region (hereinafter referred to as an "oxide semiconductor transistor" or an "OS transistor" in some cases) is known. Patent Document 1 discloses a structure in which a negative voltage is applied to a second gate electrode in an OS transistor including a first gate electrode and the second gate electrode. In Patent Document 1, the threshold voltage of the OS transistor is shifted to the positive side, and the leakage current (off-state current) when the OS transistor is off is made small The negative voltage supplied to the second gate electrode is generated by the charge pump circuit. Patent Document 2 and Patent Document 3 disclose a technique of a charge pump circuit for generating a negative voltage with high accuracy. In Patent Document 2 and Patent Document 3, a negative voltage output from a charge pump circuit is converted into a positive voltage, the difference between the positive voltage and a positive reference voltage is detected by a comparator circuit, and the operation of the charge pump circuit is controlled by feeding back the detection results.

REFERENCE

Patent Document

[Patent Document 1] United States Patent Application Publication No. 2012/0051118
[Patent Document 2] Japanese Published Patent Application No. H7-231647
[Patent Document 3] Japanese Published Patent Application No. H11-150230

SUMMARY OF THE INVENTION

Problems to be Solved by the Invention

The characteristics of the OS transistor can be stabilized by generating a negative voltage with high accuracy. However, in the case where a comparator circuit is operated all the time, there is a problem in that the power consumption is large due to the large current consumed in the comparator.

In order to reduce power consumption, power gating of the comparator circuit is effective. However, the output from the comparator circuit may become unstable before and after power gating, i.e., before and after stop and restart of power supply, and the operation of a circuit including the OS transistor may become unstable.

An object of one embodiment of the present invention is to provide a novel semiconductor device whose power consumption can be reduced. Another object of one embodiment of the present invention is to provide a novel memory device in which the output from a comparator before and after power gating can be made stable. Another object of one embodiment of the present invention is to provide a novel memory device that can achieve both of stabilization of the output from a comparator before and after power gating and lower power consumption. Another object of one embodiment of the present invention is to provide a novel semiconductor device.

Note that one embodiment of the present invention does not necessarily achieve all of these objects. The description of the plurality of objects does not mutually preclude the existence. Objects other than those listed above are apparent from the description of this specification and the like, and such objects could be objects of one embodiment of the present invention.

Means for Solving the Problems

One embodiment of the present invention is a semiconductor device including a voltage conversion circuit, a comparator, a logic circuit, a transistor, and a capacitor, and the voltage conversion circuit has a function of outputting, as a second signal, a signal obtained by conversion of a voltage of an input first signal in response to a clock signal output from the logic circuit, the comparator has a function of being controlled to be supplied with or not supplied with a power supply voltage in response to a power gating signal, the transistor has a function of holding an output voltage of the comparator in the capacitor in a period during which the transistor is in an off state, and the logic circuit has a function of switching between supply and stop of the clock signal on the basis of the voltage held in the capacitor in a period during which the power supply voltage to the comparator is stopped.

In the semiconductor device of one embodiment of the present invention, the transistor preferably includes an oxide semiconductor in a channel formation region.

In the semiconductor device of one embodiment of the present invention, the comparator is preferably supplied with the power supply voltage in a period during which the transistor is in an on state.

Another embodiment of the present invention is a method for driving the above semiconductor device, and the method is a method for driving the semiconductor device in which switching from an off state to an on state of the transistor is performed before switching from a state of stopping the power supply voltage to the comparator to a state of supplying the power supply voltage to the comparator.

Effect of the Invention

One embodiment of the present invention can provide a novel semiconductor device whose power consumption can be reduced. Another embodiment of the present invention can provide a novel memory device in which the output of a comparator before and after power gating can be made stable. Another embodiment of the present invention can provide a novel memory device in which both of stabilization of the output of a comparator before and after power gating and lower power consumption can be achieved. Another embodiment of the present invention can provide a novel semiconductor device.

One embodiment of the present invention does not necessarily have all the exemplified effects. The description of a plurality of effects does not disturb the existence of other effects. In one embodiment of the present invention, objects, effects, and novel features other than the above are apparent from the description of the specification and the drawings.

BRIEF DESCRIPTION OF DRAWINGS

FIG. 15 A flow chart showing an example of a method for manufacturing an electronic component, a top view of a semiconductor wafer and an enlarged view thereof, a schematic view illustrating a structure example of a chip, and a schematic perspective view illustrating a structure example of an electronic component.

BEST MODE FOR CARRYING OUT THE INVENTION

Figure 1A:
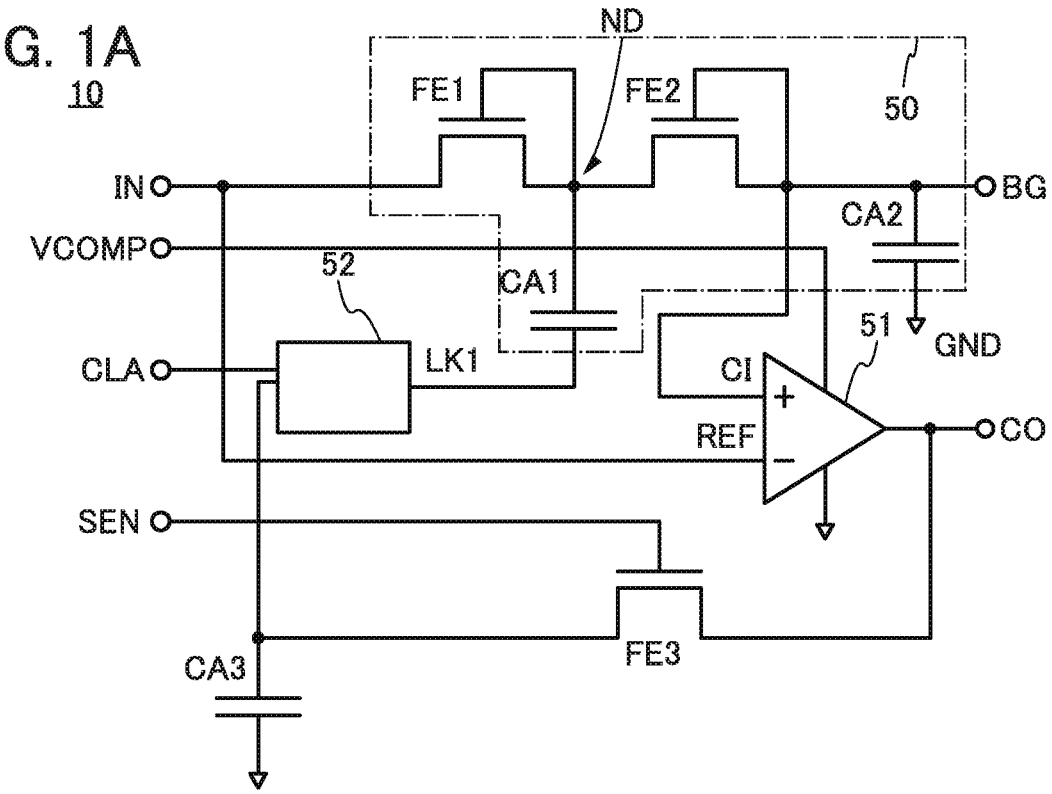
FIG. 1 Circuit diagrams each illustrating a structure example of a semiconductor device.

Embodiments of the present invention are described below. Note that any of the embodiments described in this specification can be combined as appropriate. In addition, in the case where a plurality of structure examples (including operation examples and manufacturing method examples) are described in one embodiment, the structure examples can be combined with each other as appropriate. Furthermore, the present invention can be implemented in many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, the region, and the like are exaggerated for clarity in some cases. Therefore, they are not limited to such a scale. The drawings schematically show ideal examples, and shapes, values, or the like are not limited to those shown in the drawings. For example, variation in signal, voltage, or current due to noise or variation in signal, voltage, or current due to a difference in timing can be included.

In this specification, terms for describing arrangement, such as "over" and "under", are used for convenience to describe the positional relation between components with reference to drawings in some cases. Furthermore, the positional relation between components is changed as appropriate in accordance with a direction in which each component is described. Thus, terms for the description are not limited to those used in this specification, and the description can be changed appropriately depending on the situation.

The positional relations of circuit blocks in a block diagram shown in the drawing are specified for description; therefore, the positions of circuit blocks of one embodiment of the present invention are not limited thereto. Even when different circuit blocks are illustrated to achieve individual functions in a block diagram, one circuit block may be actually configured to achieve different functions. Functions of circuit blocks are specified for description, and the circuit blocks may be provided so that processing performed in one actual circuit block is performed in the plurality of circuit blocks even when they are illustrated as one circuit block.

Furthermore, in this specification and the like, a transistor in which an oxide semiconductor is used for a semiconductor layer where a channel is formed is also referred to as an "OS transistor". Furthermore, in this specification and the like, a transistor in which silicon is used for a semiconductor layer where a channel is formed is also referred to as a "Si transistor". Furthermore, in this specification and the like, a transistor in which silicon having crystallinity is used for a semiconductor layer where a channel is formed is also referred to as a "crystalline Si transistor". The crystalline Si transistor tends to have relatively high mobility compared with the OS transistor. On the other hand, the crystalline Si transistor has difficulty in obtaining an extremely small off-state current unlike the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

When this specification and the like explicitly states that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being included in the drawings or the texts. Each of X and Y denotes an object (e.g., a device, an element, a circuit, a wiring, an electrode, a terminal, a conductive film, or a layer).

In this specification and the like, ordinal numbers such as "first," "second," and "third" are used to avoid confusion among components in some cases, and do not limit the components numerically or do not limit the order.

Embodiment 1

In this embodiment, a semiconductor device of one embodiment of the present invention is described.

<Example of Semiconductor Device>

A semiconductor device 10 illustrated in FIG. 1(A) includes a voltage conversion circuit 50, a comparator 51, a logic circuit 52, a terminal IN that is an input terminal, a terminal BG that is an output terminal, a terminal CLA that is an input terminal, a transistor FE3, a capacitor CA3, a terminal SEN, and a terminal VCOMP. The voltage conversion circuit 50 includes a transistor FE1, a capacitor CAl a transistor FE2, and a capacitor CA2.

The semiconductor device 10 measures a change in a potential output from the terminal BG side using the comparator 51 and supplies a potential from the terminal IN side when there is a change. The logic circuit 52 adjusts the potential of the terminal BG by supplying a clock signal to one electrode of the capacitor CA1 to change the potential of the other electrode of the capacitor CA1.

The comparator 51 includes a terminal CI and a terminal REF that are input terminals, and a terminal CO that is an output terminal. A reference potential (Vref) is input to the terminal REF. The terminal CI is, for example, a non-inverting input terminal, and the terminal REF is, for example, an inverting input terminal.

The comparator 51 outputs, from the terminal CO, a potential (an output voltage of the comparator) corresponding to a comparison result between a potential supplied to the terminal CI (hereinafter, Vbg) and Vref. The terminal CO outputs a high potential (hereinafter, $V_CH$) in the case where Vbg is higher than Vref and outputs a low potential in the case where Vbg is lower than or equal to Vref, for example. In an example of a timing chart shown in FIG. 5, which will be described later, a ground potential (hereinafter, GND) is used as a low potential output from the terminal CO. Furthermore, the comparator 51 is connected to the terminal VCOMP that controls supply or stop of a power supply voltage. By changing the potential, the terminal VCOMP controls supply or stop of the power supply voltage to the comparator 51. The signal supplied to the terminal VCOMP is also referred to as a power gating signal.

The on state or the off state of the transistor FE3 is controlled by a signal supplied from the terminal SEN connected to a gate. One of a source and a drain of the transistor FE3 is connected to the terminal CO. The other of the source and the drain of the transistor FE3 is connected to the capacitor CA3 and the logic circuit 52. When the transistor FE3 is turned on, the potential of the terminal CO is supplied to the capacitor CA3 and the logic circuit 52. When the transistor FE3 is turned off, charge accumulated in the capacitor CA3 is held.

The transistor FE3 is preferably an n-channel OS transistor and preferably has a low cutoff current (e.g., a current obtained when a front gate and a source have the same potential); thus, the threshold value of the transistor FE3 is preferably large enough to allow a sufficiently low cutoff current. The threshold value is, for example, larger than or equal to 0.5 V and smaller than or equal to 6 V, or larger than or equal to 1 V and smaller than or equal to 4 V.

The potential of the terminal CLA and a potential corresponding to the charge accumulated in the capacitor CA3 are supplied to the logic circuit 52. The logic circuit 52 includes LK1 that is an output terminal. In the case where the potential corresponding to the charge accumulated in the capacitor CA3 is a high potential, the logic circuit 52 outputs the potential of the terminal CLA from the terminal LK1.

The capacitance of the capacitor CA3 is preferably larger than the capacitance of the capacitor CA1. For example, the capacitance of the capacitor CA3 is three times, five times, or ten times as large as the capacitance of the capacitor CA1. With this structure, a change in the potential corresponding to the charge held in the capacitor CA3 can be made small.

Figure 1B:
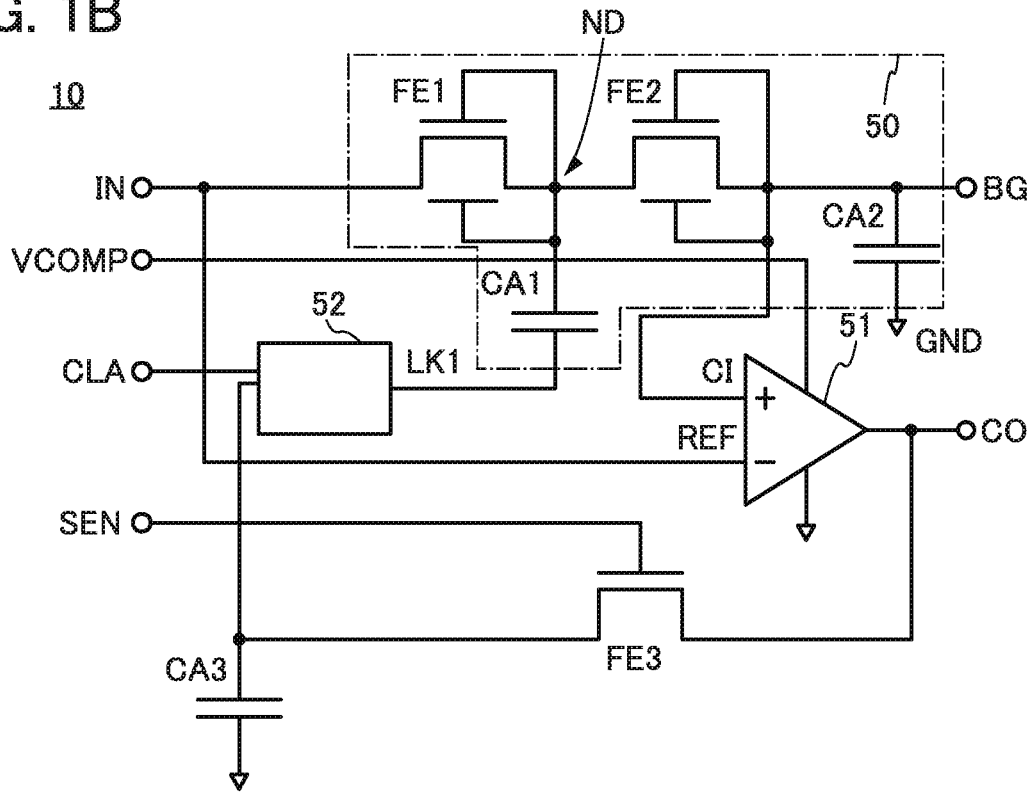

As illustrated in FIG. 1(B), each of the transistor FE1 and the transistor FE2 may include a second gate (hereinafter, referred to as a back gate). The back gate of the transistor FE1 is preferably connected to one of a source and a drain of the transistor FE1. The back gate of the transistor FE2 is preferably connected to one of a source and a drain of the transistor FE2. Here, a first gate is called a front gate in some cases.

In each of the transistors, the back gate and the front gate may be brought into an on state to be supplied with the same potential. Alternatively, a potential supplied to the back gate may be different from a potential supplied to the front gate. When a potential is supplied to the back gate, the threshold value of the transistor can be shifted. For example, when a negative constant potential is supplied to a back gate of an n-channel transistor, the threshold value of the transistor is shifted positively, in some cases. Furthermore, when a potential is supplied to the back gate, the current drive capability is improved in some cases. The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer and the semiconductor layer is covered with the back gate electrode in the plan view, the electric field blocking function can be enhanced.

The one of the source and the drain of the transistor FE2 is electrically connected to a first electrode of the capacitor CA2, the terminal CI, and the terminal BG. For example, GND is supplied to a second electrode of the capacitor CA2.

A first gate of the transistor FE2 is connected to the one of the source and the drain of the transistor FE2.

Here, the other of the source and the drain of the transistor FE2 is called a node ND. A first gate of the transistor FE1 and a first electrode of the capacitor CA1 are electrically connected to the node ND.

The other of the source and the drain of the transistor FE1 and the input terminal REF of the comparator are electrically connected to the terminal IN. Accordingly, in FIGS. 1(A) and 1(B), Vref is the same as the potential supplied to the terminal IN (hereinafter, Vbg_in). A second electrode of the capacitor CA1 is electrically connected to the terminal LK1 of the logic circuit 52. The transistor FE1 functions as a diode. The transistor FE1 is used by being diode-connected in the semiconductor device 10 illustrated in each of FIGS. 1(A) and 1(B) but may be replaced with another semiconductor element functioning as a diode.

The capacitance of the capacitor CA2 is preferably larger than the capacitance of the capacitor CA1. For example, the capacitance of the capacitor CA2 is three times, five times, or ten times as large as the capacitance of the capacitor CA1. The parasitic capacitance of the transistor FE1, a parasitic capacitance between the transistor FE1 and a wiring, or the like may be used as the capacitor CAL for example.

When an OS transistor is used as the transistor FE2, a semiconductor device that is excellent in holding charge can be achieved. In each of the semiconductor devices 10 illustrated in FIGS. 1(A) and 1(B), the transistor FE2 has an extremely low off-state current; thus, a potential can be supplied stably. An OS transistor has high withstand voltage between its source and drain. This allows the absolute value of the output voltage of the semiconductor device 10 to be large.

Owing to the high withstand voltage between the source and the drain, a transistor with high reliability can be provided. Accordingly, a semiconductor device or the like with high reliability can be provided.

The semiconductor device 10 includes the transistor FE1, whereby a potential supplied to the terminal IN can be changed. In other words, a potential can be adjusted in the semiconductor device 10. The potential adjustment is controlled with a signal from the terminal LK1 of the logic circuit 52. When the semiconductor device 10 has a function of adjusting a potential, the circuit design flexibility is enhanced.

Figure 6A:
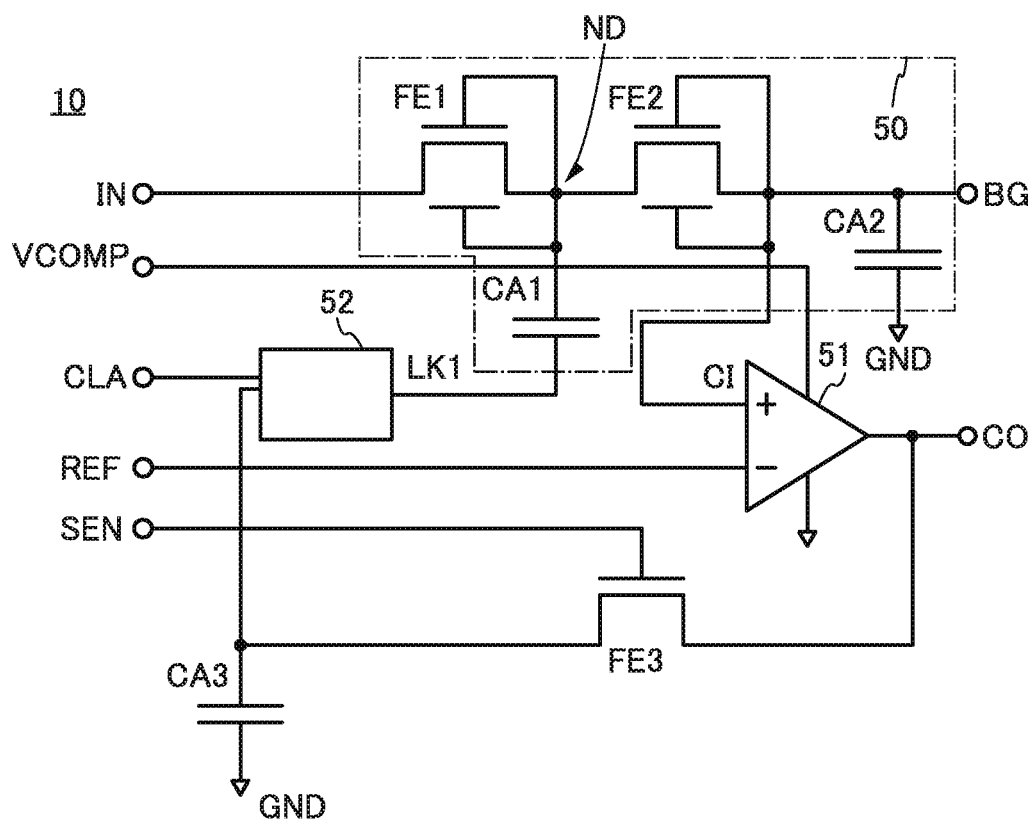
FIG. 6 Circuit diagrams each illustrating a structure example of a semiconductor device.

The number of terminals in the semiconductor device 10 illustrated in FIG. 1(B) can be smaller than that in the semiconductor device 10 illustrated in FIG. 6(A). Furthermore, the number of wirings can be reduced. In addition, in the case where a circuit that generates a voltage is necessary for each terminal, the number of the circuits can be reduced in accordance with a reduction in the number of terminals.

The semiconductor device 10 illustrated in FIG. 6(A) is different from that in FIG. 1(B) in that the terminal REF of the comparator 51 is not electrically connected to the terminal IN. The area of the semiconductor device 10 illustrated in FIG. 1(B) can be smaller than that of the semiconductor device 10 illustrated in FIG. 6(A). Note that in the semiconductor device 10 illustrated in FIG. 6(A), different potentials can be supplied to the terminal REF and the terminal IN.

Figure 6B:
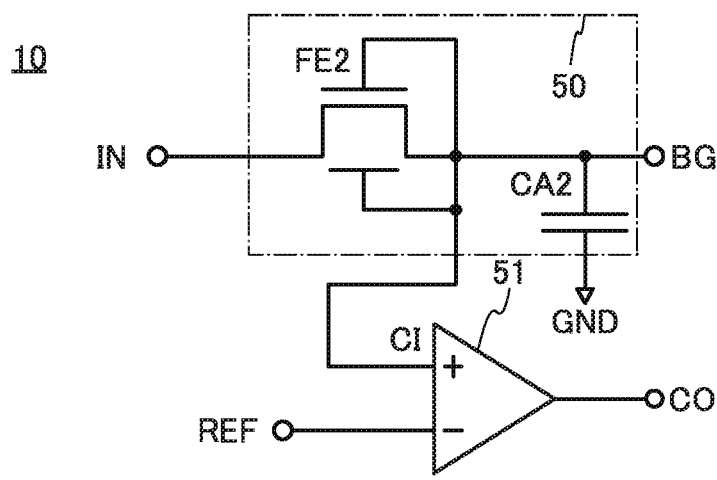

FIG. 6(B) illustrates an example in which the semiconductor device 10 does not include the transistor FE1 and the capacitor CA1. In the case where the terminal IN and the terminal REF are electrically connected to each other in FIG. 6(B), Vbg is increased by the threshold value of the transistor FE2. When the transistor FE1 and the capacitor CA1 are included as in FIG. 1(B) and FIG. 6(A), output Vbg can be adjusted (here, stepped down).

Here, each of the transistors FE1 and FE2 is preferably an n-channel OS transistor and preferably has a low cutoff current (e.g., a current obtained when a front gate and a source have the same potential). Thus, the threshold value of each of the transistors FE1 and FE2 is preferably large enough to allow a sufficiently low cutoff current. The threshold value is, for example, larger than or equal to 0.5 V and smaller than or equal to 6 V, or larger than or equal to 1 V and smaller than or equal to 4 V.

Figure 7:
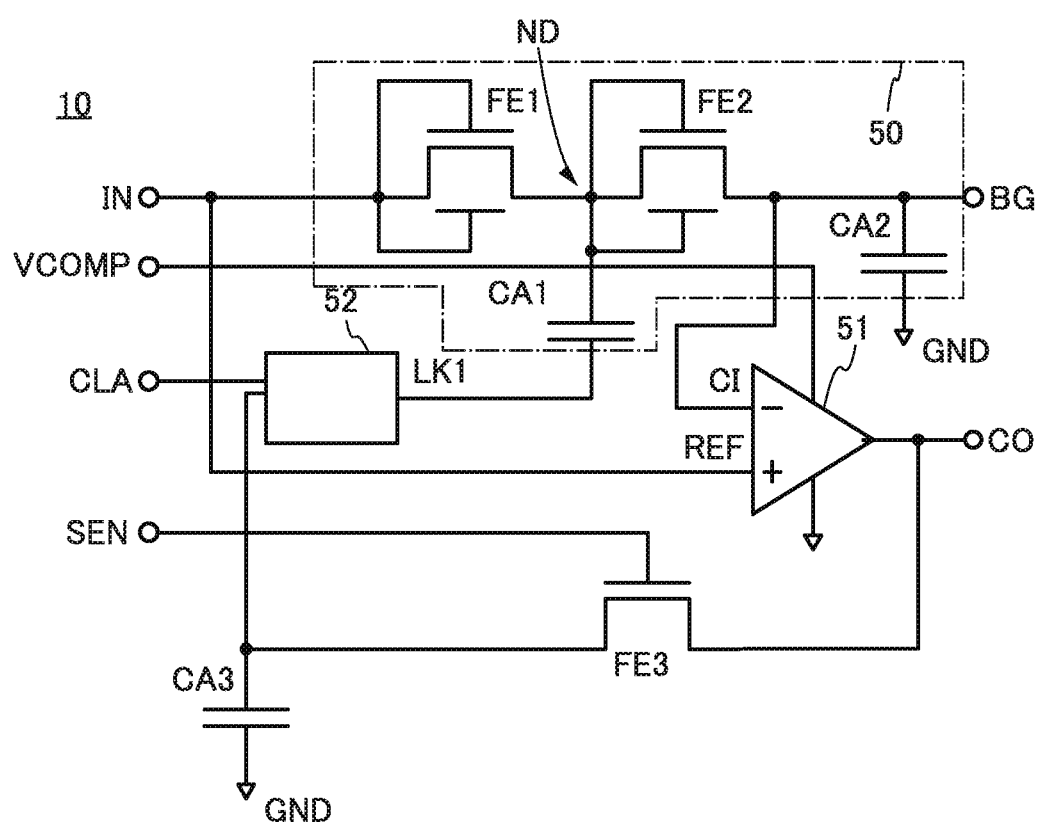
FIG. 7 A circuit diagram illustrating a structure example of a semiconductor device.

In FIG. 1 or the like, an example of a negative voltage holding circuit is illustrated as the semiconductor device 10; however, when the direction of the diode-connection of the transistor is changed, the semiconductor device 10 can be a positive voltage holding circuit. When the gate of the transistor FE1 is connected not to the node ND but to the terminal IN as illustrated in FIG. 7, a positive voltage can be generated using the capacitor CA1 and the transistor FE1. Thus, the semiconductor device 10 can be a positive voltage holding circuit.

Figure 2:
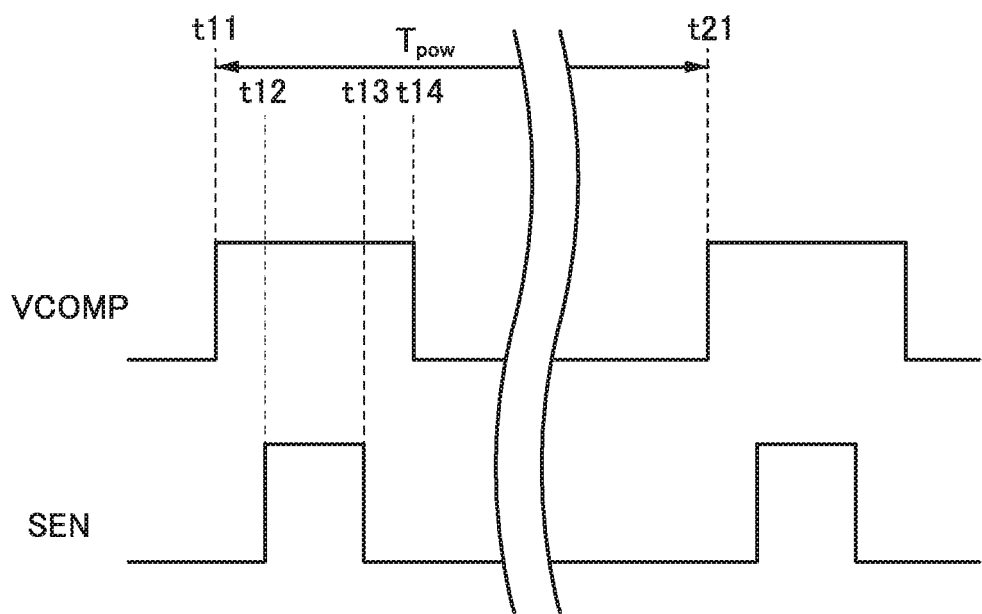
FIG. 2 A timing chart showing an operation example of a semiconductor device.

FIG. 2 shows a timing chart for describing signals supplied to the terminal VCOMP connected to the comparator 51 and the terminal SEN connected to the transistor FE3. The supply of the power supply voltage to the comparator 51 is performed by switching the potential of the terminal VCOMP to a high potential. Furthermore, the stop of the power supply voltage to the comparator 51 is performed by switching the potential of the terminal VCOMP to a low potential. In the case where the transistor FE3 is turned on, the potential of the terminal SEN is switched to a high potential. Moreover, in the case where the transistor FE3 is turned off, the potential of the terminal SEN is switched to a low potential.

In FIG. 2, time $t_{11}$ to $t_{21}$ shows a period $T_{pow}$ in which after the supply of the power supply voltage to the comparator 51 is performed and stopped temporarily, the supply of the power supply voltage is resumed. A period during which the potential of the terminal VCOMP is a low potential in the period $T_{pow}$ corresponds to a period during which the power supply voltage to the comparator 51 is stopped. The logic circuit 52 switches supply or stop of a clock signal CLK to the terminal LK1 on the basis of a voltage corresponding to charge accumulated in the capacitor CA3 in the period.

In FIG. 2, the terminal VCOMP is set at a high potential at the time $t_{11}$ to operate the comparator 51. The potential of the terminal CO can be updated by the operation of the comparator 51. Next, in FIG. 2, the terminal SEN is set at a high potential at the time t12 to bring the transistor into an on state. When the transistor is turned on, charge corresponding to the potential of the terminal CO can be accumulated in the capacitor CA3. Next, in FIG. 2, the terminal SEN is set at a low potential at the time t13 to turn off the transistor. When the transistor is turned off, charge corresponding to the potential of the terminal CO can keep being held in the capacitor CA3. Next, in FIG. 2, the terminal VCOMP is set at a low potential at the time t14 to stop the operation of the comparator 51. When the comparator 51 is stopped, the potential of the terminal CO is not updated; however, power consumption in the comparator 51 can be reduced. After the comparator 51 is operated to determine the potential of the terminal CO, the terminal SEN is set at a high potential, and charge corresponding to the potential of the terminal CO is accumulated in the capacitor CA3, whereby the output of the comparator 51 before and after power gating can be made stable.

In a structure of one embodiment of the present invention, the power consumption of the comparator 51 is reduced and charge corresponding to the potential of the terminal CO keeps being held in the capacitor CA3. Even when the supply of the power supply voltage to the comparator 51 is stopped and thus the potential of the terminal CO is not updated, the potential of the terminal CO can keep being supplied to the logic circuit 52 as the potential corresponding to the charge accumulated in the capacitor CA3. When the transistor FE3 is an OS transistor, the cutoff current can be reduced, so that a period during which the charge accumulated in the capacitor CA3 can be held can be made longer. Since the potential of the terminal CO can keep being supplied to the logic circuit 52 even in a state where the comparator 51 is power-gated, both of stabilization of the output of the comparator before and after power gating and the lower power consumption can be achieved.

Figure 3A:
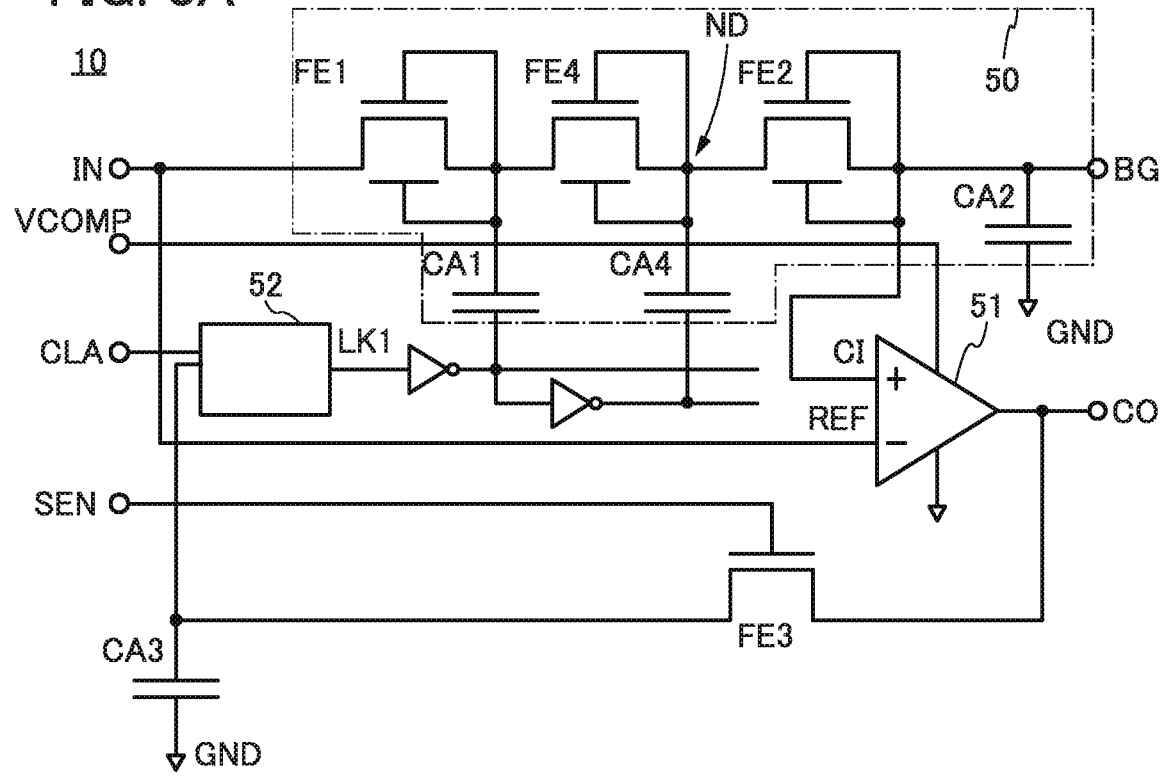
FIG. 3 Circuit diagrams each illustrating a structure example of a semiconductor device.

The semiconductor device 10 illustrated in FIG. 3(A) is different from that in FIG. 1(B) in that a transistor FE4 is included between the transistor FE1 and the transistor FE2. Furthermore, the semiconductor device 10 illustrated in FIG. 3(A) is different from that in FIG. 1(B) in including a capacitor CA4.

One of a source and a drain of the transistor FE4 is electrically connected to the node ND, and the other is electrically connected to the one of the source and the drain of the transistor FE1. One electrode of the capacitor CA4 is electrically connected to the one of the source and the drain of the transistor FE4. The other electrode of the capacitor CA1 is electrically connected to the terminal LK1 through an inverter. The other electrode of the capacitor CA4 is electrically connected to the terminal LK1 through two stages of inverters.

Figure 3B:
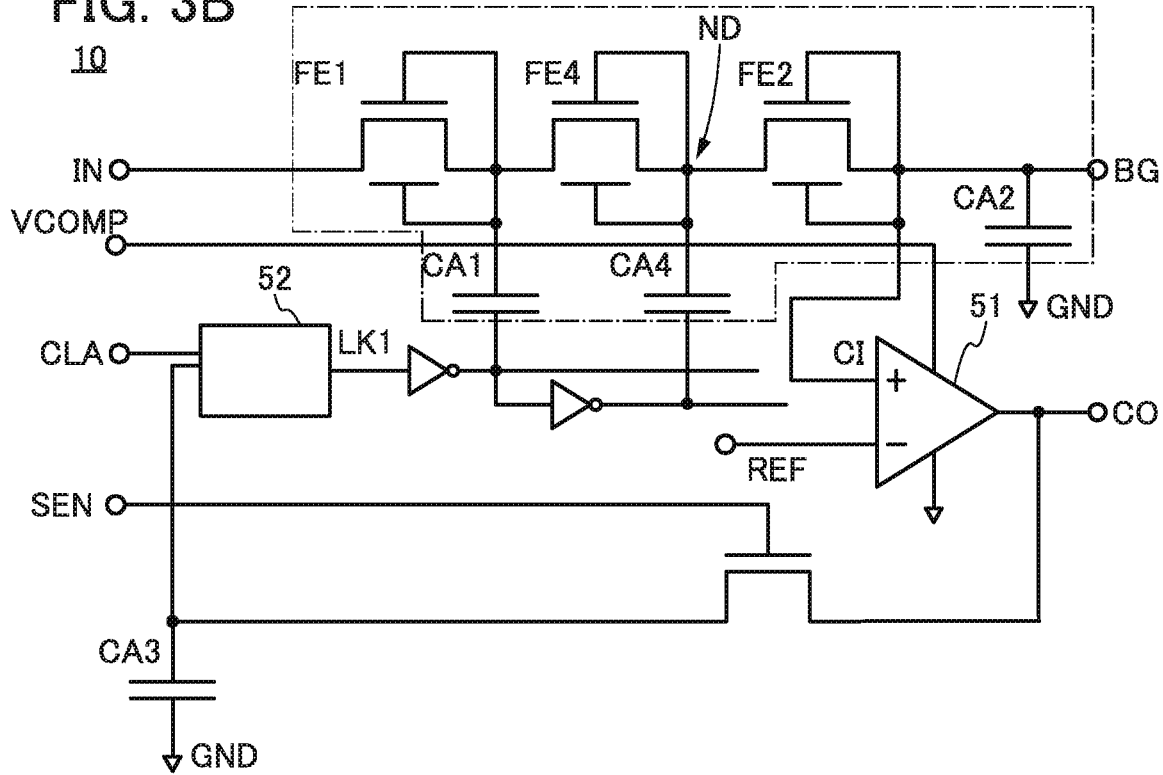

FIG. 3(B) is different from FIG. 3(A) in that the terminal IN and the terminal REF are not electrically connected to each other.

<Application Example of Semiconductor Device 10>

Figure 4A:
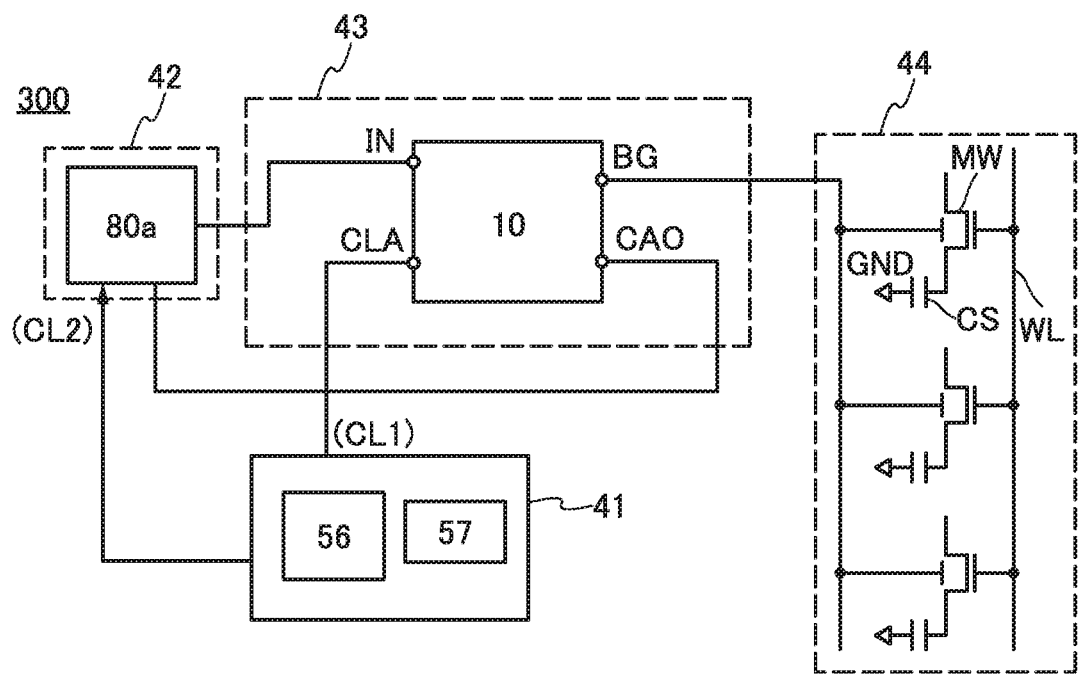
FIG. 4 Block diagrams each illustrating a structure example of a semiconductor device.

A semiconductor device 300 illustrated in FIG. 4(A) includes a control portion 41, a voltage generation portion 42, a voltage holding portion 43, and a cell array 44. The cell array 44 forms part of a memory device, a CPU, or an imaging device, for example. The cell array 44 preferably includes one or more OS transistors. Furthermore, a potential output from the voltage holding portion 43 is supplied to a back gate of the OS transistor.

The voltage generation portion 42 includes a charge pump 80a. The voltage generation portion 42 may include a plurality of charge pumps. For example, the charge pump 80a and a second charge pump may be included, and different potentials may be output from them. Moreover, as described later, the voltage generation portion 42 may include a clock buffer circuit.

Figure 4B:
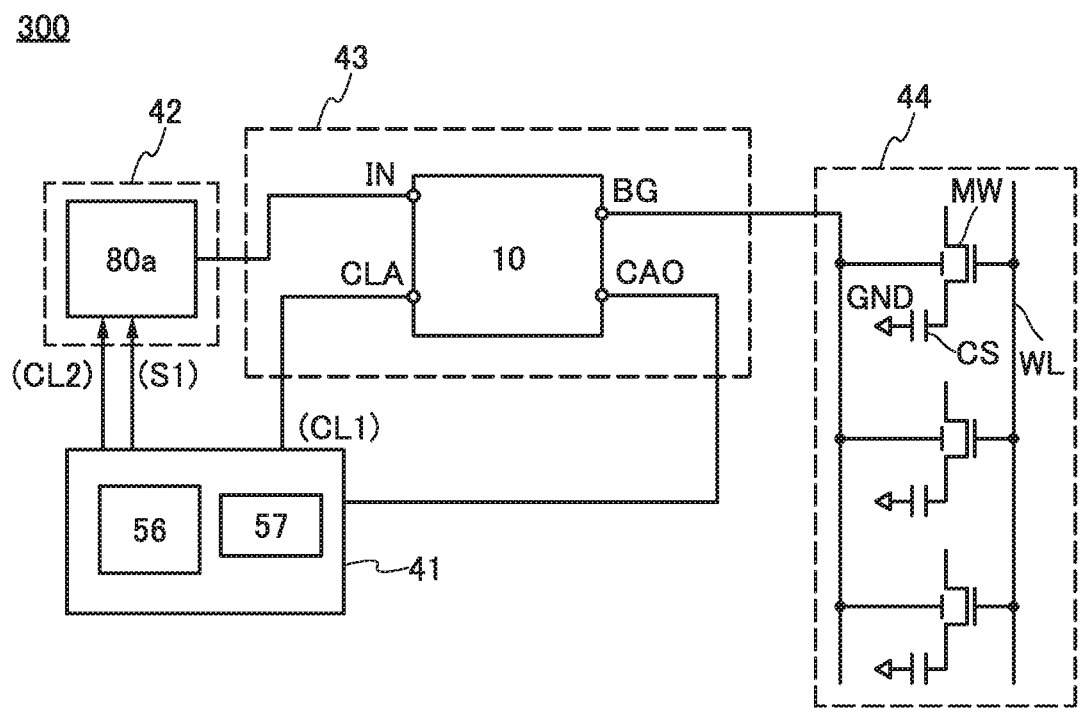

The voltage holding portion 43 includes the semiconductor device 10. Note that the capacitor CA3 included in the semiconductor device 10 (specifically, a terminal for supplying a potential corresponding to the charge accumulated in the capacitor CA3; hereinafter, a terminal CAO) may have a structure of being connected to the logic circuit 52, and in addition, as illustrated in FIG. 4(B), a signal from the terminal CAO may be input to the control portion 41, and a signal (a signal S1 in the figure) may be supplied to the charge pump through the control portion 41. In each of FIG. 4(A) and FIG. 4(B), the terminal IN included in the semiconductor device 10 functions as an input terminal of the voltage holding portion 43, and the terminal BG functions as an output terminal of the voltage holding portion 43.

The control portion 41 includes a logic circuit 56 and a clock generation circuit 57. The clock generation circuit 57 can generate clock signals such as a signal CL1 and a signal CL2.

The control portion 41 supplies the signal CL2 to the charge pump 80a. In addition, the control portion 41 supplies the signal CL1 to the terminal CLA of the logic circuit 52 in the semiconductor device 10 included in the voltage holding portion 43.

Here, the transistor FE1 and the transistor FE2 included in the voltage holding portion 43 have a high withstand voltage. Furthermore, the voltage holding portion 43 can reduce voltage using the semiconductor device 10. Thus, from the semiconductor device 300, a voltage whose absolute value is larger than the withstand voltage of the voltage generation portion 42 can be obtained.

The cell array 44 preferably includes one or more OS transistors each having a back gate. A potential output from the semiconductor device 10 included in the voltage holding portion 43 is supplied to the back gate. The cell array 44 illustrated in FIG. 4 includes a transistor MW, a capacitor CS, and a wiring WL. The transistor MW is an OS transistor having a back gate. A front gate of the transistor MW is electrically connected to the wiring WL. One of a source and a drain of the transistor MW is electrically connected to one electrode of the capacitor CS. The other electrode of the capacitor CS is connected to GND or the like, for example.

The terminal BG of the semiconductor device 10 included in the voltage holding portion 43 is electrically connected to the transistor MW.

Note that the terminal BG of the semiconductor device 10 included in the voltage holding portion 43 and the transistor MW may be electrically connected to each other through a buffer circuit or the like.

<Operation Example of Semiconductor Device 300>

Figure 5:
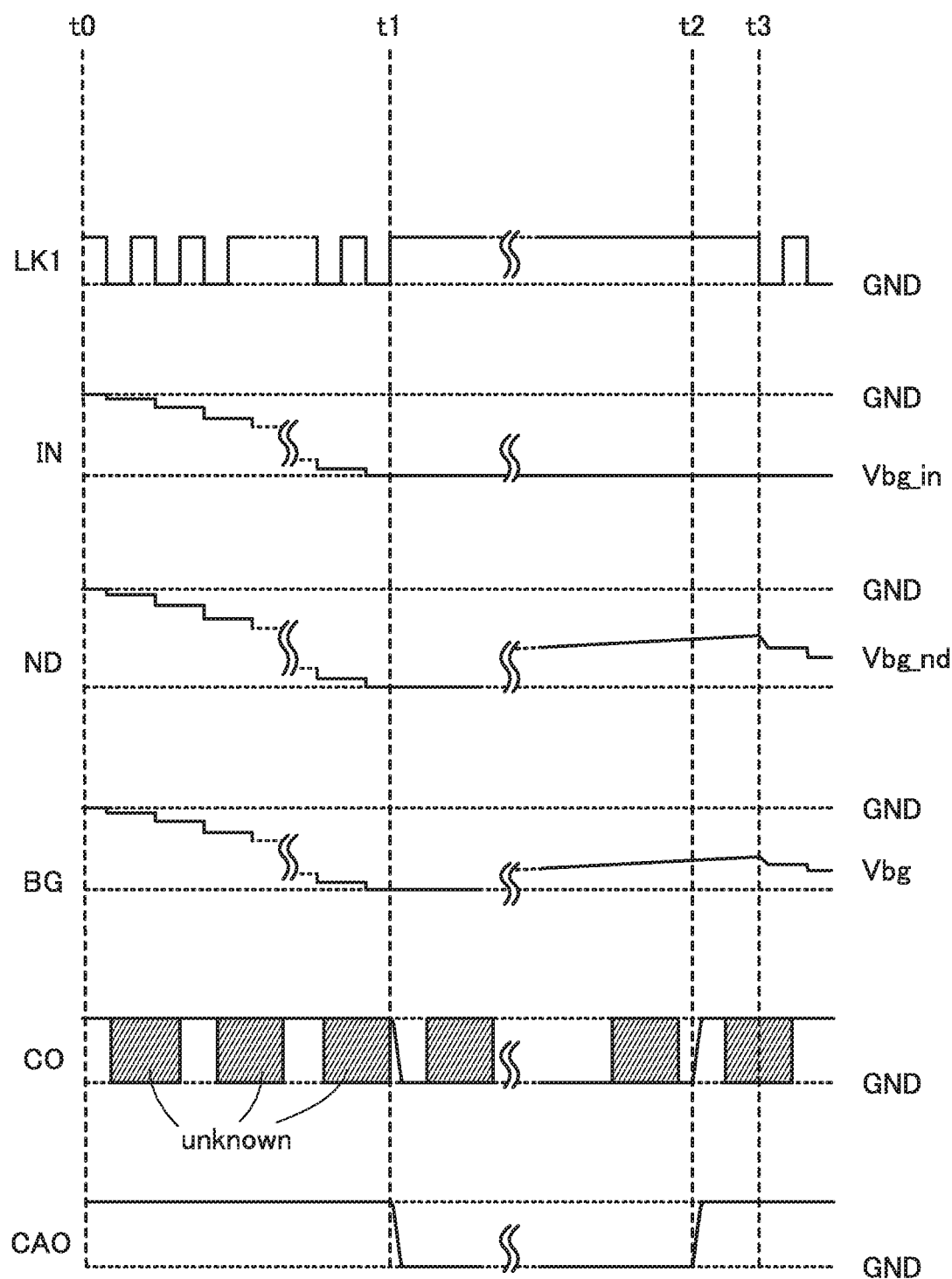
FIG. 5 A timing chart showing an operation example of a semiconductor device.

FIG. 5 shows a timing chart for explaining an example of an operation of the semiconductor device 300 illustrated in FIG. 4(B).

The operation of the semiconductor device 300 at time t0 is described. A potential corresponding to the comparison result between Vbg and Vref in the semiconductor device 10 included in the voltage holding portion 43 is output from the terminal CO. The potential of the terminal CO is supplied to the logic circuit 52. FIG. 5 shows an example in which Vbg is higher than Vref in the semiconductor device 10, so that $V_CH$ is output from the terminal CO, and $V_CH$ is supplied to the logic circuit 52.

Moreover, $V_CH$ is supplied to the control portion 41 from the terminal CAO of the semiconductor device 10. In the case where the potential of the terminal CAO is $V_CH$, the signal CL1 is supplied from the control portion 41 to the logic circuit 52 in the semiconductor device 10. As described above, the potential of the terminal CAO corresponds to a potential obtained by intermittently obtaining the output signal from the terminal CO connected to the comparator 51. Note that the comparator 51 is controlled to be power-gated intermittently, so that the potential of the terminal CO has an undefined value (is unknown). In the structure of one embodiment of the present invention, a structure in which even when the supply of the power supply voltage to the comparator 51 is stopped, charge corresponding to the potential ($V_CH$) of the terminal CO keeps being held in the capacitor CA3 can be employed; thus, both of stabilization of the operation and lower power consumption can be achieved. In the case where the terminal CAO is $V_CH$, the signal CL1 is supplied from the control portion 41 to the logic circuit 52 in the semiconductor device 10.

When $V_CH$ is supplied to the control portion 41, the signal CL2 is supplied from the control portion 41 to the voltage generation portion 42, and the charge pump 80a is brought into an operation state. In a period from the time t0 to time t1, a potential supplied to the terminal IN (hereinafter, Vbg_in) is gradually increased or reduced (in the example shown in FIG. 5, the potential is reduced in each clock) in response to the operation of the charge pump 80a. In the case where the semiconductor devices 10 illustrated in FIG. 1(A), FIG. 1(B), and FIG. 3(A) are used, the potentials of Vref and Vbg_in can be supplied from the same charge pump. Thus, the number of charge pumps included in the semiconductor device 300 can be reduced, so that the circuit area can be reduced. Furthermore, the power consumption can be reduced.

Before the time t0, the terminal LK1 of the logic circuit 52 is kept at a high potential. When $V_CH$ is supplied to the logic circuit 52 at Time t0, the logic circuit 52 outputs the signal CL1 from the terminal LK1, and the signal CL1 is supplied to the other electrode of the capacitor CA1. The signal CL1 is changed from a high potential to a low potential; thus, the potential of the other electrode of the capacitor CA1 is reduced. The other electrode of the capacitor CA1 is reduced by, for example, $\Delta V_C$. Accordingly, a potential supplied to the node ND (hereinafter, Vbg_nd) and the potential of the terminal BG (Vbg) are reduced. The threshold voltage of the transistor FE1 is Vt1, and the threshold voltage of the transistor FE2 is Vt2. Vbg_nd=(Vbg_in+Vt1−ΔV$_C$) is satisfied. Vbg=(Vbg_nd+Vt2) is satisfied. Here, as an example where the semiconductor device 10 generates a negative voltage, the case where a voltage is reduced is described; however, in the case where the semiconductor device 10 generates a positive voltage, the potential of the node ND may be increased by output of the signal from the terminal LK1.

Next, when Vbg of the terminal BG becomes lower than Vref at the time t1 in the semiconductor device 10, GND is output from the terminal CO, and the potential of the terminal CAO also becomes GND. Therefore, the terminal LK1 of the logic circuit 52 stops output of the signal CL1, and a high potential is held. Moreover, in the control portion 41, the generation of the signal CL1 is stopped.

The comparator 51 is controlled to be intermittently power-gated as described above, so that the potential of the terminal CO has an undefined value (is unknown) intermittently. In the structure of one embodiment of the present invention, even when the supply of the power supply voltage to the comparator 51 is stopped (power gating), charge corresponding to the potential (GND) of the terminal CO can keep being held in the capacitor CA3, so that both of stabilization of the operation and lower power consumption can be achieved.

At the time t1, Vbg_in is −5 V, Vbg_nd is −8 V, and Vbg is −5 V, for example.

During the time t1 to t2, Vbg and Vbg_nd are gradually changed by the leakage current of the cell array 44 or the like.

At the time t2, Vbg becomes higher than Vref in the semiconductor device 10. Then, V$_C$H is supplied from the comparator 51 included in the semiconductor device 10 to the control portion 41 and the logic circuit 52 included in the semiconductor device.

At the time t2, V$_C$H is output from the terminal CO, and the potential of the terminal CAO also becomes V$_C$H, and thus V$_C$H is supplied to the logic circuit 52. After that, at the time t3, the logic circuit 52 supplies a low potential to the node ND from the terminal LK1.

When Vbg becomes less than or equal to Vref in the semiconductor device 10, V$_C$H is output from the terminal CO, the potential of the terminal CAO also becomes V$_C$H, and a high potential is held in the terminal LK1 of the logic circuit 52. Moreover, in the control portion 41, the generation of the signal CL1 is stopped.

The voltage generation portion 42 can be formed using a charge pump circuit or the like. The structure example of the voltage generation portion 42 is described below.

Figure 8A:
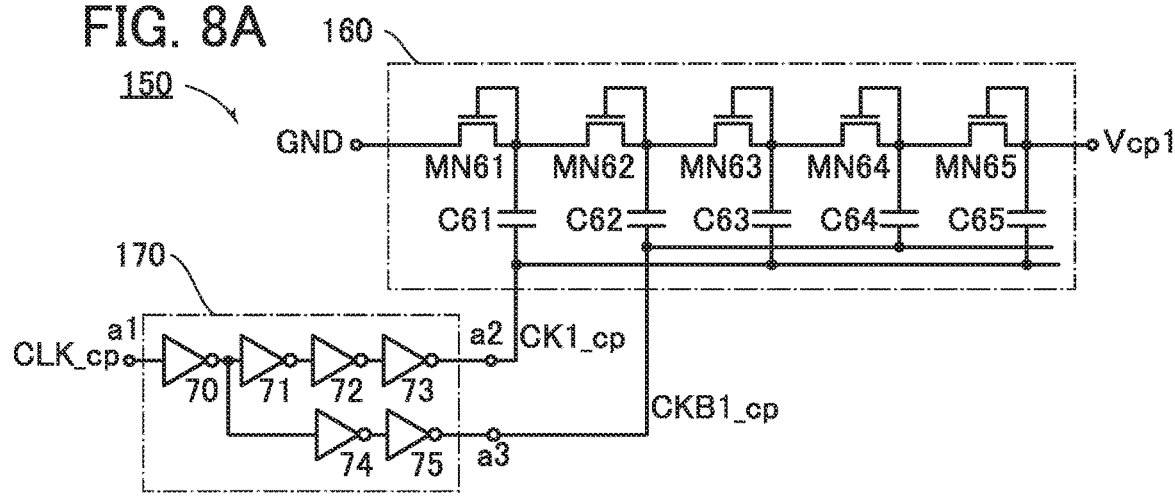
FIG. 8 Circuit diagrams each illustrating a structure example of a voltage generation circuit.

A negative potential generation circuit 150 illustrated in FIG. 8(A) includes a charge pump 160 and a clock buffer circuit 170. The negative potential generation circuit 150 and the charge pump 160 can be used as the voltage generation portion 42 and the charge pump 80a, respectively.

<Clock Buffer Circuit>

The clock buffer circuit 170 includes inverters 70 to 75 and terminals a1 to a3. The clock buffer circuit 170 has a function of generating signals CK1_cp and CKB1_cp from a signal CLK_cp. The terminal a1 is an input terminal for the signal CLK_cp, and the terminals a2 and a3 are output terminals for the signals CK1_cp and CKB1_cp, respectively. The signal CLK_cp is a clock signal output from the control portion 41. For example, the control portion 41 divides a reference clock signal and generates the signal CLK_cp. The signal CK1_cp and the signal CKB1_cp are complementary clock signals.

Figure 8B:
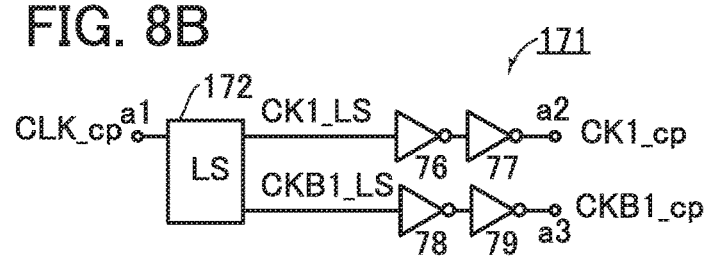

The clock buffer circuit may be provided with a level shifter (LS). FIG. 8(B) illustrates such a structure example. A clock buffer circuit 171 illustrated in FIG. 8(B) includes an LS 172 and inverters 76 to 79. The LS 172 level-shifts the signal CLK_cp to generate signals CK1_LS and CKB1_LS. The signal CK1_cp is output from the inverter 77, and the signal CKB1_cp is output from the inverter 79.

Although the clock buffer circuit 170 is provided with six inverters, the number of inverters is not limited to six. The clock buffer circuit 170 includes at least the inverters 70 and 71. The clock buffer circuit 170 can have a function of a delay circuit for the signal CLK_cp. Accordingly, the number of inverters can be determined depending on the delay time. For example, the same applies to the clock buffer circuit 171.

<Charge Pump>

The charge pump 160 is a step-down charge pump and has a function of generating a potential Vcp1 by lowering the pressure of the potential GND. Note that the input potential is not limited to the potential GND. The charge pump 160 includes transistors MN61 to MN65 and capacitors C61 to C65. The number of stages of the charge pump 160 is five but is not limited thereto.

Figure 8C:
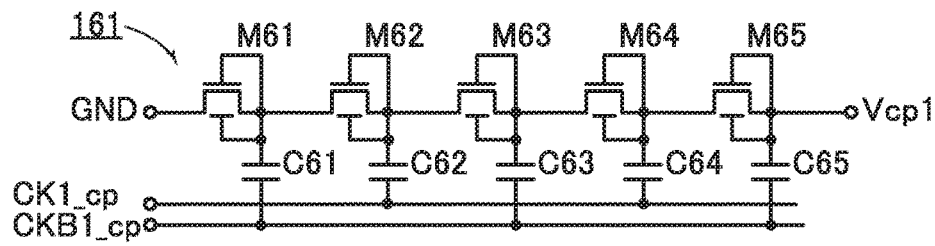
Figure 8D:
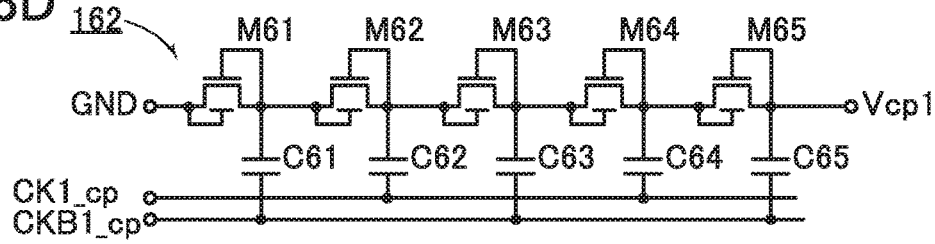
Figure 8E:
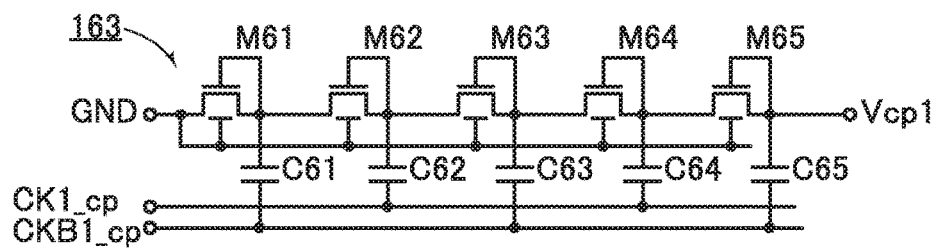

The transistors MN61 to MN65 are diode-connected n-channel Si transistors. Instead of the transistors MN61 to MN65, diode-connected p-channel Si transistors may be provided or diode-connected OS transistors may be provided. In the case where OS transistors are provided, OS transistors having back gates may be provided. FIGS. 8(C), 8(D), and 8(E) illustrate such structure examples.

A charge pump 161 illustrated in FIG. 8(C) includes transistors M61 to M65 and the capacitors C61 to C65. Charge pumps 162 and 163 illustrated in FIGS. 8(D) and 8(E) are modification examples of the charge pump 161. Each of the charge pumps 161, 162, and 163 can be used as the charge pump 80a.

Here, an example in which a Dickson charge pump is provided in the negative potential generation portion is described, but a Cockcroft-Walton charge pump may be provided.

An OS transistor has high withstand voltage between its source and drain. Thus, it is preferable to use an OS transistor for the charge pumps 161, 162, and 163 and the like.

Figure 9A:
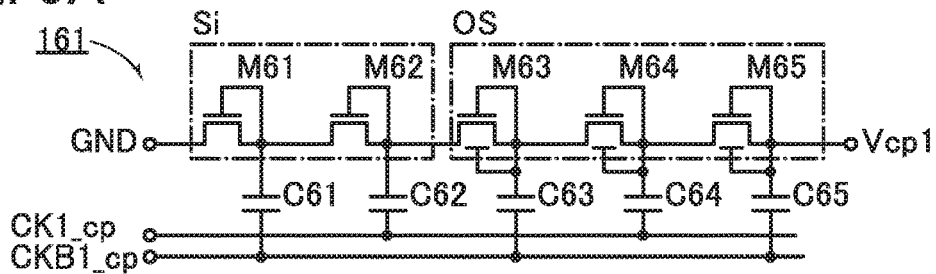
FIG. 9 Circuit diagrams each illustrating a structure example of a voltage generation circuit.

It is also possible to use both Si transistors and OS transistors. OS transistors are preferably used as transistors in latter stages in each of which a higher voltage is applied between its source and drain. Each of the OS transistors preferably has a back gate. For example, the charge pumps 161, 162, and 163 illustrated in FIG. 9(A), FIG. 9(D), and FIG. 9(E) are illustrated as examples in which Si transistors are used as the transistors M61 and M62 and OS transistors are used as the transistors M63 to M65 in the charge pumps 161, 162, and 163 illustrated in FIGS. 8(A), 8(B), and 8(C).

Here, charge (e.g. fixed charge or the like) in a transistor at an interface between a semiconductor layer and an insulating layer on the back channel side or in the insulating layer causes a variation or fluctuation in the threshold voltage in some cases. In other words, it may be a factor in decreasing the stability of the transistor. By provision of the back gate, a highly reliable transistor can be achieved, so that the reliability of the charge pump can be improved. In addition, when the same potential as that of a front gate is supplied to the back gate, for example, the current drive capability of the transistor is improved, and the charging rate of the capacity included in the charge pump is improved, in some cases.

Here, in the semiconductor device of one embodiment of the present invention, OS transistors can be placed so as to be stacked over a circuit using Si transistors. When they are placed so as to be stacked, the circuit area seen from the top surface can be reduced.

Figure 9B:
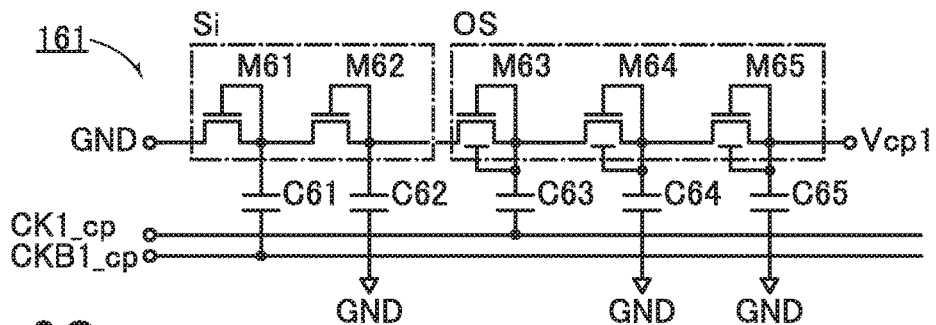

FIG. 9(B) illustrates an example where the capacitors C62, C64, and C65 are electrically connected to GND.

Figure 9C:
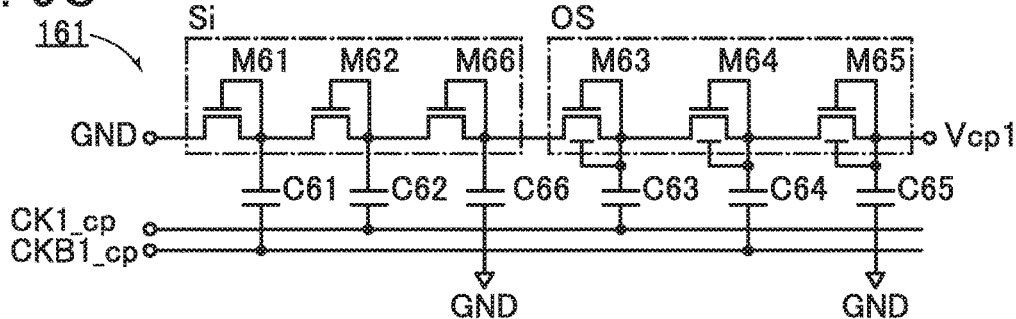
Figure 9D:
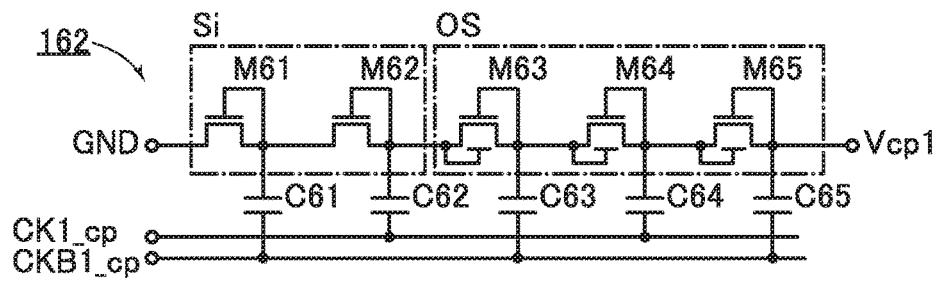
Figure 9E:
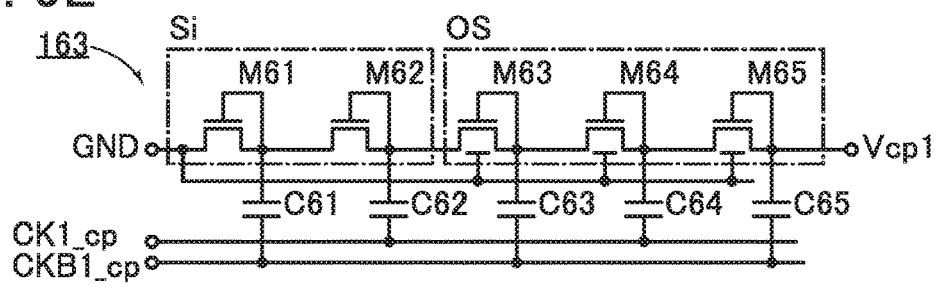

FIG. 9(C) illustrates an example in which a transistor M66, which is a Si transistor, is included between the transistors M62 and M63. A capacitor C66 is connected to a source or a drain of the transistor M66. Si transistors in three adjacent stages are connected in series, and in the following three stages, OS transistors are connected in series. The capacitor C66 in the third stage and the capacitor C65 in the sixth stage are electrically connected to GND.

<Structure Example of Memory Cell>

FIGS. 10(A) to 10(E) illustrate examples of a circuit structure that a cell (hereinafter, a memory cell as an example) of the cell array 44 described in FIG. 4(A) can have. In each of the circuit diagrams of memory cells illustrated in FIGS. 10(A) to 10(E), a data voltage is written from a source line SL or the bit line BL, and controlling the voltages of a write word line WWL and a read word line RWL can control writing or reading of the data voltage.

Figure 10A:
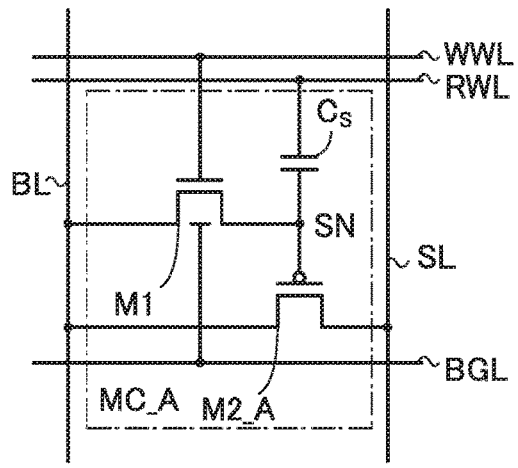
FIG. 10 Diagrams each illustrating a structure of a memory cell.

A memory cell MC_A illustrated in FIG. 10(A) includes a transistor M1, a transistor M2_A, and a capacitor $C_S$. The transistor M1 includes a back gate electrode and has a structure in which a voltage supplied to the back gate electrode can be controlled by a back gate line BGL. The transistor M2_A is a p-channel transistor. The transistor M1 is turned off, whereby charge corresponding to a data voltage can be held at a node SN. The transistor M2_A controls the current that flows depending on charge corresponding to a held data voltage. The structure in FIG. 10(A) can be used for the cell array 44 in FIG. 4(A).

Figure 10B:
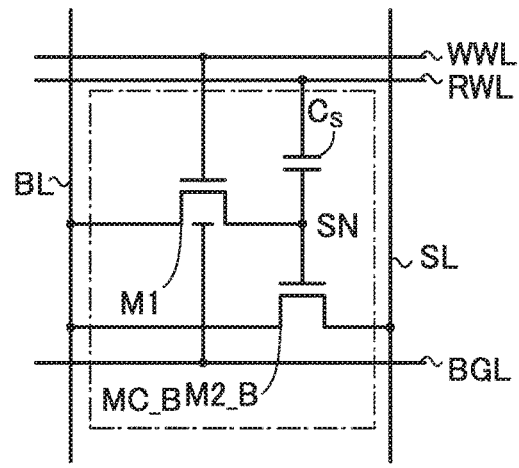

A memory cell MC_B illustrated in FIG. 10(B) includes the transistor M1, a transistor M2_B, and the capacitor $C_S$. The transistor M2_B is an n-channel transistor, which is a different point from FIG. 10(A). The structure in FIG. 10(B) can be used for the cell array 44 in FIG. 4(A).

Figure 10C:
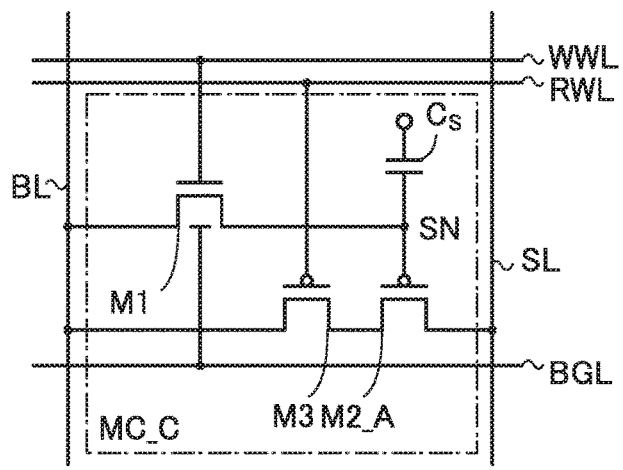

A memory cell MC_C illustrated in FIG. 10(C) includes the transistor M1, the transistor M2_A, a transistor M3, and the capacitor $C_S$. The memory cell MC_C includes the transistor M3, which is a different point from FIG. 10(A). The transistor M3 is, like the transistor M2_A, a p-channel transistor. The transistor M3 is turned off, whereby a current flowing between the bit line BL and the source line SL can be controlled. The structure in FIG. 10(C) can be used for the cell array 44 in FIG. 4(A).

Figure 10D:
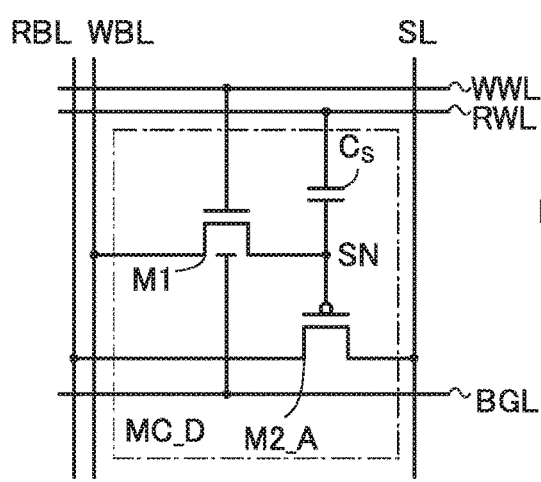

A memory cell MC_D illustrated in FIG. 10(D) includes the transistor M1, the transistor M2_A, and the capacitor $C_S$. The transistor M1 is connected to a write bit line WBL, and the transistor M2_A is connected to a read bit line RBL. In the structure in FIG. 10(D), for example, the read bit line RBL can be used to read out a data voltage, and the write bit line WBL can be used to write a data voltage. The structure in FIG. 10(D) can be used for the cell array 44 in FIG. 4(A).

Figure 10E:
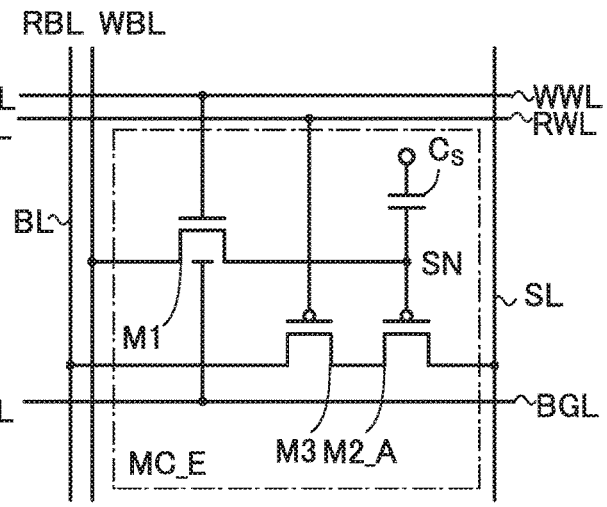

A memory cell MC_E illustrated in FIG. 10(E) includes the transistor M1, the transistor M2_A, the transistor M3, and the capacitor $C_S$. The memory cell MC_E includes the transistor M3, which is a different point from FIG. 10(A). The transistor M3 is, like the transistor M2_A, a p-channel transistor. The transistor M3 is turned off, whereby a current flowing between the bit line BL and the source line SL can be controlled. In addition, the transistor M1 is connected to the write bit line WBL, and the transistor M2_A is connected to the read bit line RBL in the memory cell MC_E illustrated in FIG. 10(E). In the structure in FIG. 10(E), for example, the read bit line RBL can be used to read out a data voltage, and the write bit line WBL can be used to write a data voltage. The structure in FIG. 10(E) can be used for the cell array 44 in FIG. 4(A).

Figure 11A:
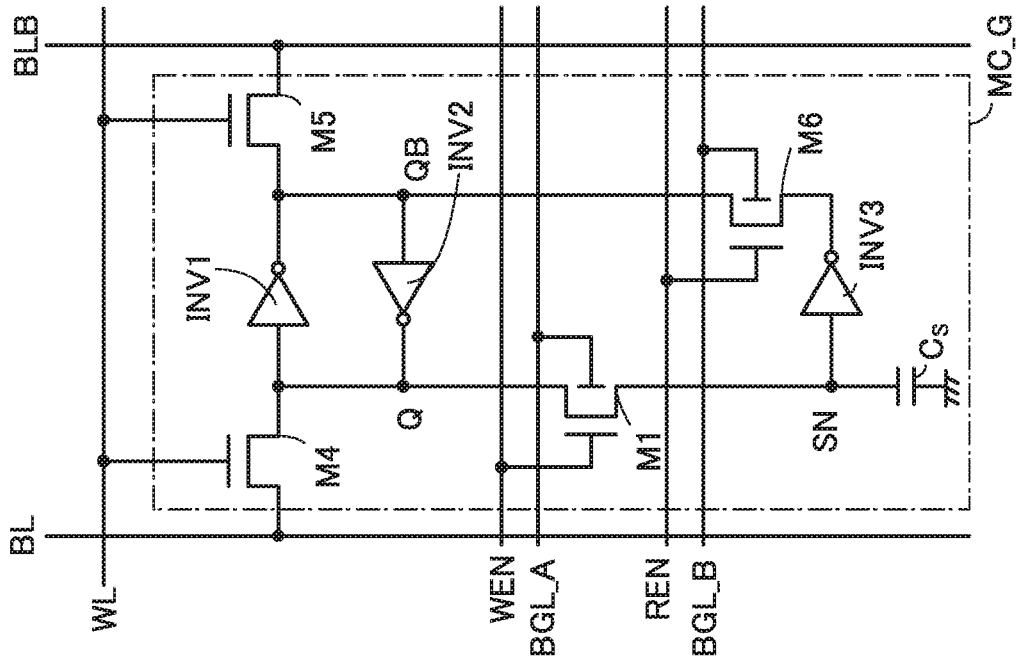
FIG. 11 Diagrams each illustrating a structure of a memory cell.

A memory cell MC_F illustrated in FIG. 11(A) includes transistors M4 and M5, inverters INV1 and INV2, transistors M1_Q and M1_QB, and the capacitors $C_S$ which form an SRAM (Static RAM).

The memory cell MC_F controls a control line ENL, thus controlling the backup of the data voltages of nodes Q and QB of the SRAM in nodes SN1 and SN2 and the recovery of the data voltages from the nodes SN1 and SN2 to the nodes Q and QB. Each of the transistors M1_Q and M1_QB includes a back gate electrode and thus has a structure in which a voltage supplied to the back gate electrode can be controlled by the back gate line BGL. The transistors M1_Q and M1_QB are turned off, whereby charge corresponding to the data voltages can be held in the nodes SN1 and SN2. The structure in FIG. 11(A) can be used for the cell array 44 in FIG. 4(A).

Figure 11B:
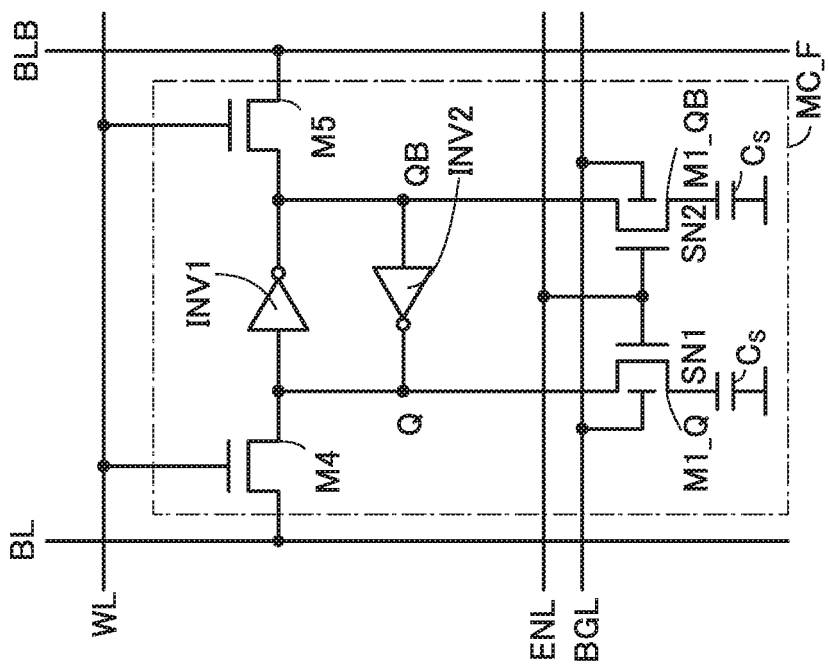

A memory cell MC_G illustrated in FIG. 11(B) includes the transistors M4 and M5, inverters INV1 and INV2, the transistor M1, a transistor M6, the capacitor $C_S$, and an inverter INV3 which form an SRAM (Static RAM).

The memory cell MC_G controls a write control line WEN; thus controlling the backup of the data voltage of the node Q of the SRAM in the node SN. Moreover, the memory cell MC_G controls a read control line REN, thus controlling the recovery of the data voltage from the node SN to the node QB through the inverter INV3. The transistor M1 includes a back gate electrode and thus has a structure in which a voltage supplied to the back gate electrode can be controlled by a back gate line BGL_A. The transistor M6 includes a back gate electrode and thus has a structure in which a voltage supplied to the back gate electrode can be controlled by a back gate line BGL_B. The transistor M1 is turned off, whereby charge corresponding to a data voltage can be held in the node SN. The transistor M6 is turned off, whereby a leakage current from the node QB can be suppressed. The structure in FIG. 11(B) can be used for the cell array 44 in FIG. 4(A).

As described above, one embodiment of the present invention can be used for a variety of structures.

Embodiment 2

In this embodiment, a semiconductor device or the like having a function of directly comparing two negative voltages is described as a comparator that can be used as the comparator 51 described in Embodiment 1 or the like. The terminal CI, the terminal REF, and the terminal CO described in Embodiment 1 are applicable to a terminal IN1, a terminal IN2, and a terminal OUT1 of the comparator described in this embodiment, respectively.

The comparator described in this embodiment preferably includes an OS transistor. The OS transistor preferably has a back gate. A structure example of a semiconductor device including the OS transistor and the transistor FE1 and the transistor FE2 described in Embodiment 1 is described in a later embodiment.

STRUCTURE EXAMPLE 1 OF COMPARATOR

Figure 12A:
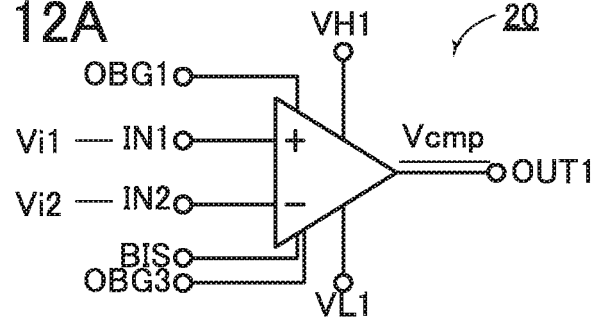
FIG. 12 Circuit diagrams illustrating a structure example of a comparative circuit and a diagram schematically showing drain current-gate voltage characteristics of transistors.

FIG. 12(A) is a circuit diagram illustrating a structure example of a comparator. A comparator 20 includes terminals IN1, IN2, OUT1, VH1, VL1, BIS, OSG1, and OSG3.

The comparator 20 has a function of comparing a potential Vi1 of the terminal IN1 and a potential Vi2 of the terminal IN2 and a function of outputting a potential Vcmp, which has a potential level corresponding to the comparison results, from the terminal OUT1.

In the example of FIG. 12(A), the terminal IN1 is a non-inverting input terminal (terminal (+)), and the terminal IN2 is an inverting input terminal (terminal (−)). Therefore, when Vi1<Vi2 is satisfied, the potential Vcmp output from the terminal OUT1 is at a low level, whereas when Vi1>Vi2 is satisfied, the potential Vcmp is at a high level.

The terminal VH1 is an input terminal for a high power supply potential Vdd (hereinafter referred to as potential Vdd). The terminal VL1 is an input terminal for a low power supply potential Vss (hereinafter referred to as potential Vss). Each of the terminals BIS, OBG1, and OBG3 is an input terminal for a bias potential.

Figure 12B:
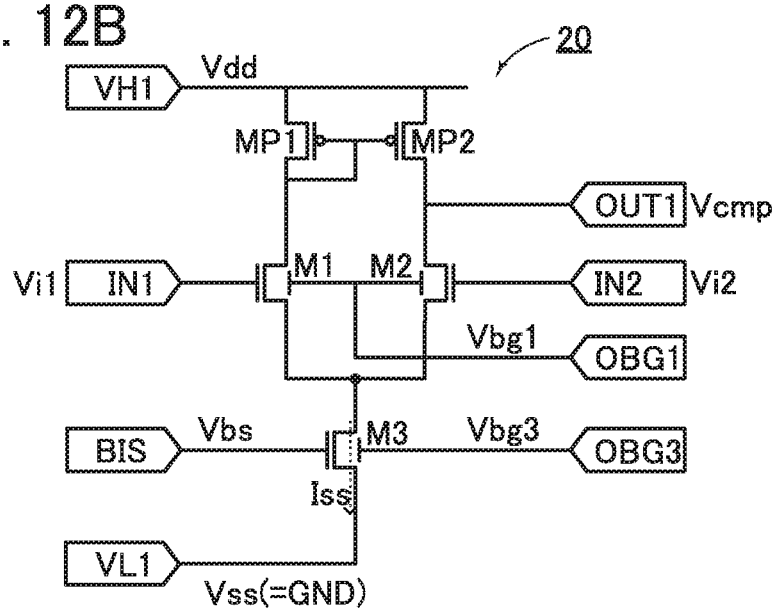

FIG. 12(B) illustrates a more specific structure example of the comparator 20. FIG. 12(B) is an example in which the comparator 20 is composed of a differential amplifier circuit having a differential pair. The comparator 20 includes transistors MP1, MP2, and the transistors M1 to M3. The differential amplifier circuit is composed of these transistors.

The transistors M1 and M2 are transistors that form the differential pair. A gate of the transistor M1 is electrically connected to the terminal IN1, and a gate of the transistor M2 is electrically connected to the terminal IN2. The back gates of the transistors M1 and M2 are electrically connected to the terminal OBG1. A drain of the transistor M2 is electrically connected to the terminal OUT1.

The transistor M3 functions as a current source for supplying a current Iss. A gate, a back gate, and a source of the transistor M3 are electrically connected to the terminal BIS, the terminal OBG3, and the terminal VL1, respectively. A bias potential Vbg3 for controlling a back gate potential of the transistor M3 (hereinafter referred to as potential Vbg3) is input to the terminal OBG3. For example, the potential Vss is input to the terminal OBG3. A bias potential Vbs for determining the level of the current Iss (hereinafter referred to as potential Vbs) is input to the terminal BIS.

The transistor MP1 functions as a load for the transistor M1, and the transistor MP2 serves as a load for the transistor M2. Here, the transistor MP1 and the transistor MP2 form a current mirror circuit.

The transistors MP1 and MP2 are p-channel transistors, and there is no particular limitation on the type of the transistors. For example, the transistors MP1 and MP2 are Si transistors.

The transistors M1-M3 are n-channel transistors including back gates. As each of the transistors M1-M3, a transistor whose back gate and gate face each other with a channel formation region sandwiched therebetween can be used.

As a semiconductor used for channel formation regions of the transistor M1, the transistor M2, and the transistor M3, a semiconductor containing a metal oxide (an oxide semiconductor), silicon, or the like can be given. The transistor M1, the transistor M2, and the transistor M3 are preferably OS transistors.

<Operation Example of Comparator>

The case where the transistors M1 to M3 do not have back gates is considered here. The threshold voltages (hereinafter referred to as Vt in some cases) of the transistors M1 to M3 are larger than 0 V.

In order that the comparator 20 has a function of comparing the potential Vi1 and the potential Vi2, the transistors M1 and MN2 needs to be turned on, and the current Iss needs to flow through the transistor M3. In the case where the potential Vdd is 3V, the potential Vbs is 3 V, the potential Vi1 is −2 V, and the potential Vi2 is −3V, for example, the potential Vss needs to be lower than −3 V. In other words, the potential Vss in the comparator 20 becomes a negative potential when the potentials Vi1 and Vi2 are negative potentials. High-accuracy supply of the potential Vss is required for a high-accuracy comparison by the comparator 20; however, that the potential Vss is a negative potential causes a reduction in an improvement in comparison accuracy. Thus, a comparator more complex than the comparator 20 is used to compare two negative potentials at high accuracy.

When the substrate potential is a ground potential (=0 V) in the comparator 20, in the case where the negative potential Vss is input to the source of the n-channel transistor (the transistor M3), a forward bias potential is applied to a parasitic diode (a pn junction diode) between a p-well and a source region. This causes backflow of large current from the substrate to the source region. In order to prevent the backflow of the current, a triple-well structure in which an n-channel transistor is surrounded by an n-well is generally employed. However, when the n-channel transistor has a triple-well structure, the area of the comparator 20 becomes large.

This embodiment can provide the comparator 20 that is free of the above problem. An operation example of the comparator 20 is described with reference to FIG. 12(B) and FIG. 12(C). Here, using the case where the potential Vdd is 3 V, the potential Vbs is 3 V, the potential Vi1 is −2 V, and the potential Vi2 is −3 V, as an example, the operation of the comparator 20 is described.

Figure 12C:
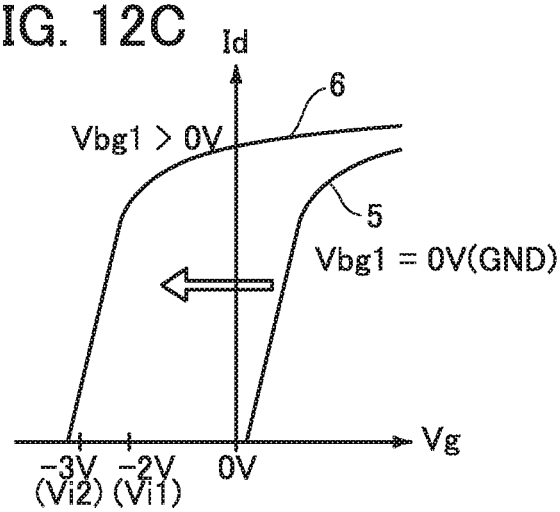

FIG. 12(C) is a diagram schematically showing drain current-gate voltage ($I_d$-$V_g$) characteristics of the transistors M1 and M2. A curve 5 represents the $I_d$-$V_g$ characteristics when the potential Vbg1 is 0 V, and a curve 6 represents the $I_d$-$V_g$ characteristics when the potential Vbg1 is a positive potential.

When the potential Vbg1 is 0 V and the potential Vss is a ground potential (hereinafter referred to as a potential GND in some cases), the Vt of the transistors M1 and M2 are higher than the potentials Vi1 and V12, respectively; thus, the comparator 20 is out of operation.

By the input of a positive potential to the terminal OBG1, the Vt of the transistors M1 and M2 can be shifted to the negative-potential side to be lower than the potentials Vi1 and V12. For example, by the input of the potential Vdd to the terminals OBG1 and OBG3, the Vt of the transistors M1 to M3 can be shifted to the negative-potential side without the increase in number of potentials needed for the operation.

Even when the potential Vss is 0 V (the ground potential), the transistors M1 and M2 can be turned on since they have the electrical characteristics shown by the curve 6. The comparator 20 can thus be operated to detect a difference between the potential Vi1 and the potential V12. Here, the comparator 20 outputs the high-level potential Vcmp because Vi1>Vi2 is satisfied.

As described above, the comparator 20 can directly compare two negative potentials without a complex circuit structure. Since the potential Vss can be 0 V (ground potential), the accuracy of the comparator 20 can be improved. When the transistors M1 to M3 are OS transistors, the channel formation regions of the transistors M1-M3 can be in a state of being insulated from the substrate without employment of a triple-well structure. Accordingly, the circuit area of the comparator 20 can be reduced.

Other structure examples of the comparator are described with reference to FIG. 12(A) to FIG. 14(B) below.

STRUCTURE EXAMPLES 2 TO 4 OF COMPARATOR

Here, modification examples of the transistor M3 functioning as a current source of the comparator 20 are described. The back gate of the transistor M3 illustrated in FIG. 12(B) may be electrically connected to the front gate or drain thereof.

Alternatively, a transistor having no back gate may be used instead of the transistor M3 illustrated in FIG. 12(B). By using the transistor M3 having a back gate as a current source, the following effect can be obtained, for example. As is understood from FIG. 12(C), the potential Vbs can be lowered and can be, for example, GND when the positive potential Vbg3 is input to the back gate of the transistor M3. The transconductance of the comparator 20 can be controlled with the potential Vbg3, so that higher speed of the comparator 20 can be achieved.

STRUCTURE EXAMPLE 5 OF COMPARATOR

A modification example of a differential pair is described here. In FIG. 12(B), the same potential is supplied to the transistors M1 and M2 from the terminal OBG1; however, by provision of two terminals, the back gate of the transistor M1 and the back gate of the transistor M2 may be supplied with different potentials. For example, the potential Vg1 and the potential Vbg2 are supplied to the back gate of the transistor M1 and the back gate of the transistor M2. With such a structure, the potential of the back gate of the transistor M1 and the potential of the back gate of the transistor M2 can be controlled independently. Although the transistor M1 and the transistor M2 are designed to have the same electrical characteristics, in practice, the electrical characteristics of the transistor M1 and the transistor M2 do not perfectly correspond to each other due to variation in process. In view of this, the potentials Vbg1 and Vbg2 are determined to cancel an offset voltage. Here, when any of the potentials Vss, Vbg1, and Vbg2 is input to the terminal OBG3, the number of potentials the comparator 20 handle can be reduced. In addition, when one of the potential Vbg1 and the potential Vbg2 is the potential Vdd, the number of potentials the comparator 20 handles can be reduced.

The bias potential Vbs2 can be supplied to the back gates of the transistors M1 and M2, and thus the transistors M1 and M2 function as a constant current source. Alternatively, the transistors M1 and M2 may be diode-connected. Alternatively, the transistors M1 and M2 may be replaced with resistors.

Figure 13A:
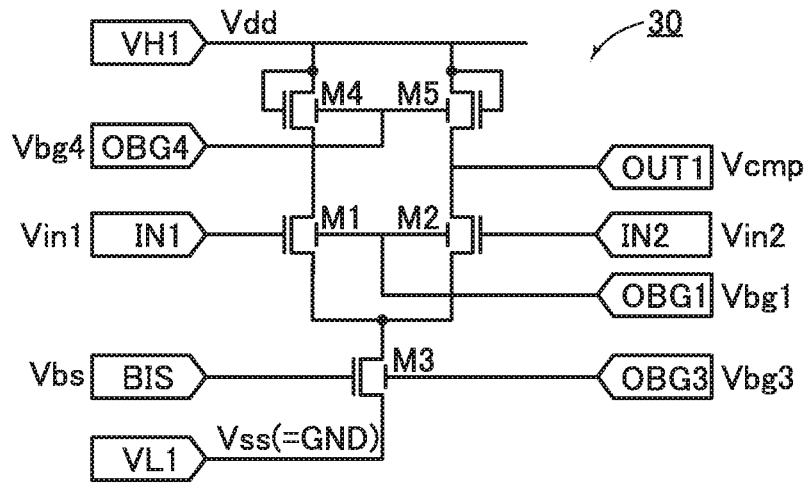
FIG. 13 Circuit diagrams each illustrating a structure example of a comparative circuit.
Figure 13B:
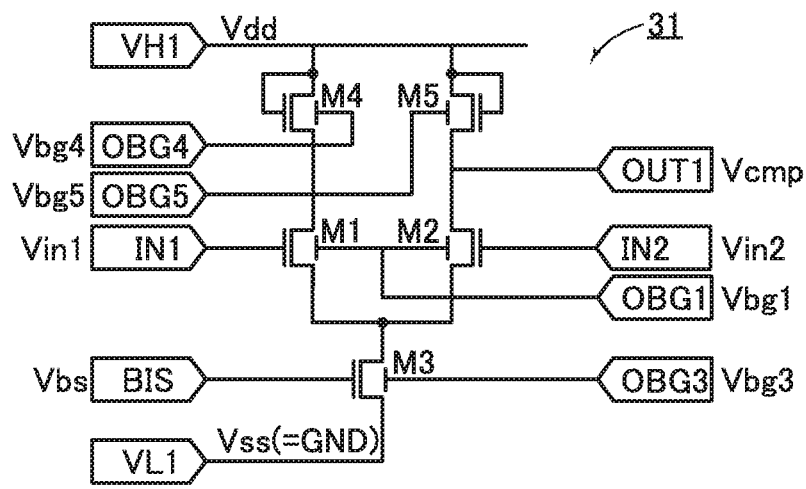

FIGS. 13(A) to 13(B) illustrate modification examples of the comparator.

Comparators illustrated in FIGS. 13(A) to 13(B) are each an example in which a load is formed using two n-channel transistors.

A comparator 30 illustrated in FIG. 13(A) includes a terminal OBG4 and transistors M4 and M5. The transistors M4 and M5 are diode-connected transistors and function as loads.

The transistors M4 and M5 each have a back gate. The transistors M4 and M5 can be OS transistors like the transistor M1. The back gates of the transistors M4 and M5 are electrically connected to the terminal OBG4. The terminal OBG4 is a terminal for inputting a bias potential, to which a potential Vbg4 is input. The back gate potentials of the transistors M4 and M5 are adjusted with the potential Vbg4, whereby drain current flowing in the transistors M4 and M5 can be adjusted. For example, when the potential Vbg4 is a positive potential, the current drive capabilities of the transistors M4 and M5 can be improved.

A comparator 31 illustrated in FIG. 13(B) is a modification example of the comparator 30. The comparator 31 includes a terminal OBG5, and the back gate of the transistor M5 is electrically connected to the terminal OBG5. The terminal OBG5 is a terminal for inputting a bias potential, to which a potential Vbg5 is input.

In the comparator 31, the back gate potential of the transistor M4 and the back gate potential of the transistor M5 can be controlled independently. In other words, by the input of the potentials Vbg4 and Vbg5, the amount of Vt shift of the transistor M4 and the amount of Vt shift of the transistor M5 can be determined independently. The potentials Vbg4 and Vbg5 are determined to cancel variation in electrical characteristics of the transistor M4 and the transistor M5.

Figure 13C:
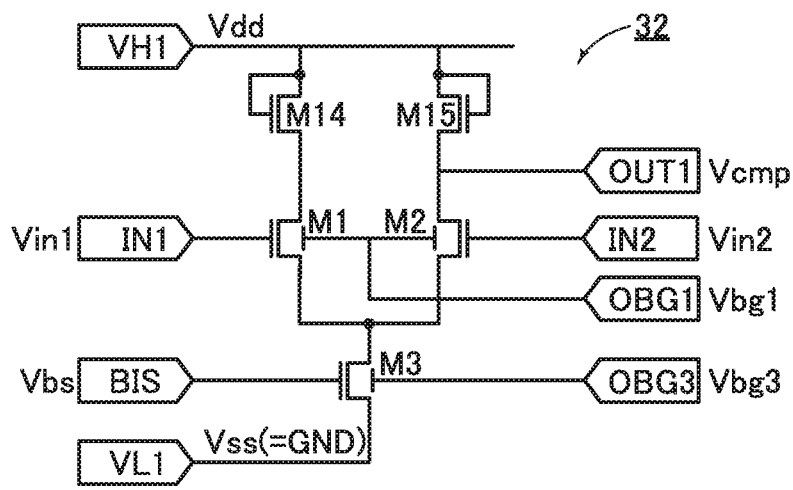

A comparator 32 illustrated in FIG. 13(C) is a modification example of the comparator 30. In the comparator 32, instead of the transistors M4 and M5, transistors M14 and M15 which do not have back gates are provided. The transistors M14 and M15 may be OS transistors like the transistor M1, or may be Si transistors.

STRUCTURE EXAMPLES 6, 7 OF COMPARATOR

Figure 14A:
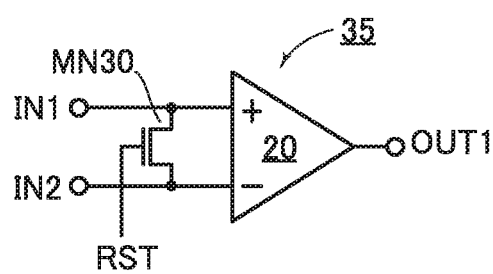
FIG. 14 Circuit diagrams each illustrating a structure example of a comparative circuit.
Figure 14B:
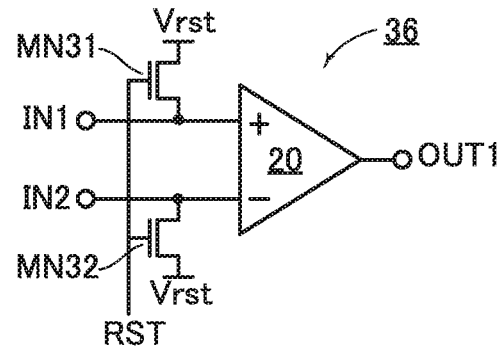

FIG. 14(A) and FIG. 14(B) illustrate structure examples of a resettable comparator.

A comparator 35 illustrated in FIG. 14(A) corresponds to a circuit in which the comparator 20 is provided with a transistor MN30. A comparator 36 illustrated in FIG. 14(B) corresponds to a circuit in which the comparator 20 is provided with transistors MN31 and MN32. Note that a comparator with a different structure may be provided as the comparator 35. The same applies to the comparator 36.

The transistor MN30 of the comparator 35 functions as a switch for setting the terminal IN1 and the terminal IN2 to the same potential. A signal RST (a reset signal) is input to a gate of the transistor MN30.

The transistor MN31 of the comparator 36 has a function of resetting the potential of the terminal IN1 to a potential Vrst. The transistor MN32 has a function of resetting the potential of the terminal IN2 to the potential Vrst. The signal RST is input to gates of the transistors MN31 and MN32. For example, the potential Vss is input as the potential Vrst.

The transistor MN30 may be a Si transistor or may be an OS transistor. In the case where the transistor MN30 is an OS transistor, the transistor MN30 can be provided with a back gate that is electrically connected to the gate. The transistor MN30 may be a p-channel transistor. The same applies to the transistors MN31 and MN32.

Embodiment 3

In this embodiment, an IC chip, an electronic component, electronic devices, and the like are described as application examples of a semiconductor device.

<Example of Method for Manufacturing Electronic Component>

FIG. 15(A) is a flow chart showing an example of a method for manufacturing an electronic component. Note that an electronic component is also referred to as a semiconductor package or an IC package. For the electronic component, there are a plurality of standards and names corresponding to a terminal extraction direction and a terminal shape. Thus, examples of the electronic component are described in this embodiment.

A semiconductor device composed of a transistor is completed by integrating a plurality of detachable components on a printed circuit board through an assembly process (post-process). The post-process can be completed through steps shown in FIG. 15(A). Specifically, after an element substrate obtained in the pre-process is completed (Step ST71), a back surface of the substrate is ground. The substrate is thinned in this step to reduce warpage or the like of the substrate in the pre-process and to reduce the size of the component. Next, a dicing step is performed to divide the substrate into a plurality of chips (Step ST72).

FIG. 15(B) is a top view of a semiconductor wafer 7100 before the dicing step is performed. FIG. 15(C) is a partial enlarged view of FIG. 15(B). A plurality of circuit regions 7102 is provided on the semiconductor wafer 7100. The semiconductor device of an embodiment of the present invention is provided in the circuit region 7102.

Each of the plurality of circuit regions 7102 is surrounded by a separation region 7104. Separation lines (also referred to as "dicing lines") 7106 are set at a position overlapping with the separation regions 7104. In the dicing step (Step ST72), the semiconductor wafer 7100 is cut along the separation lines 7106, whereby chips 7110 including the circuit regions 7102 are cut out from the semiconductor wafer 7100. FIG. 15(D) illustrates an enlarged view of the chip 7110.

Furthermore, a conductive layer or a semiconductor layer may be provided in the separation regions 7104. When a conductive layer or a semiconductor layer is provided in the separation regions 7104, ESD that might be caused in a dicing step is relieved, so that a decrease in the yield due to the dicing step can be prevented. Furthermore, a dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing the semiconductor device can be reduced. Moreover, the productivity of the semiconductor device can be improved.

After Step ST72 is performed, a die bonding step in which the separated chips are separately picked out and mounted and bonded on a lead frame is performed (Step ST73). As a method for bonding the chip to the lead frame in the die bonding step, a method suitable for the product may be selected. The bonding may be performed, for example, with a resin or a tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing with epoxy resin or the like (Step ST75). The molding step is performed, whereby the inside of the electronic component is filled with a resin, so that damage to the circuit portion and the wire embedded in the electronic component caused by external mechanical force can be reduced, and in addition, deterioration of characteristics due to moisture or dust can be reduced. The lead of the lead frame is subjected to plating treatment. Then, the lead is cut and processed (Step ST76). By the plating treatment, corrosion of the lead can be prevented, and soldering for mounting the electronic component on a printed circuit board in a later step can be performed more surely. Next, printing (marking) is performed on a surface of the package (Step ST77). Through an inspection step (Step ST78), the electronic component is completed (Step ST79). When the semiconductor device described in the above embodiment is incorporated, a low-power small electronic component can be provided.

FIG. 15(E) illustrates a schematic perspective view of the completed electronic component. FIG. 15(E) illustrates a schematic perspective view of a QFP (Quad Flat Package) as an example of the electronic component. As illustrated in FIG. 15(E), an electronic component 7000 includes a lead 7001 and the chip 7110.

The electronic component 7000 is mounted on a printed circuit board 7002, for example. A plurality of electronic components 7000 described above which are combined and electrically connected to each other over the printed circuit board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used for electronic components (IC chips) of electronic devices in a wide variety of fields, such as digital signal processing, software-defined radio systems, avionics (electronic devices related to aircraft, such as communication systems, navigation systems, autopilot systems, and flight management systems), ASIC prototyping, medical image processing, voice recognition, encryption, bioinformatics (bioinformatics), emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described below with reference to FIG. 16(A) to FIG. 17(E). A touch panel device including a touch sensor is preferably used in a display portion of the electronic device in FIG. 16(A) or the like. With the touch panel device, the display portion can also function as an input portion of the electronic device.

Figure 16A:
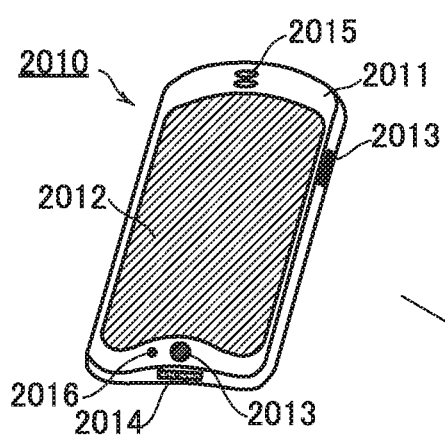
FIG. 16 Diagrams each illustrating a structure example of an electronic device.

An information terminal 2010 illustrated in FIG. 16(A) includes, in addition to a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting text, and screen switching of the display portion 2012 can be performed by touching the display portion 2012 with a finger or the like. The information terminal 2010 can also be operated by inputting sound from the microphone 2016. Various operations such as power on/off operation and screen switching of the display portion 2012 can also be performed by operating the operation button 2013.

Figure 16B:
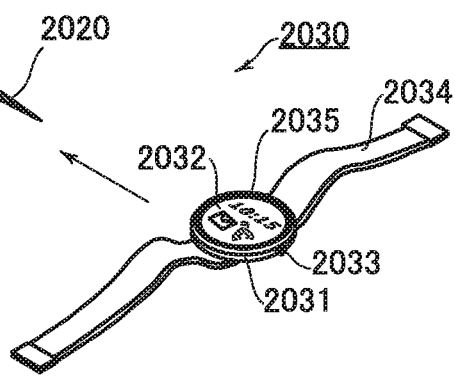

FIG. 16(B) illustrates an example of a wrist-watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., GPS (a global positioning system)), or the like.

Wireless communication devices with the same standard may be incorporated into the information terminal 2010 and the information terminal 2030 to perform interactive communication through a wireless signal 2020. When the information terminal 2010 receives an incoming e-mail or call, for example, information notifying the incoming e-mail or call can be displayed on the display portion 2032 of the information terminal 2030.

Figure 16C:
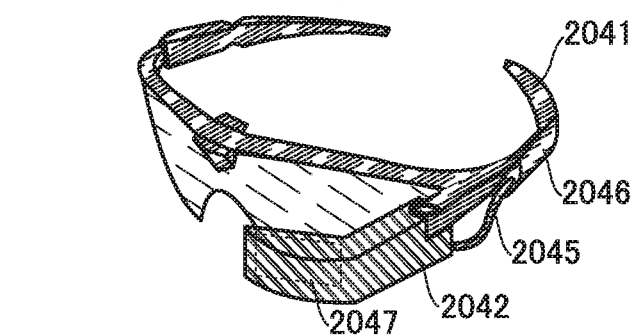

FIG. 16(C) illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a memory device, and a variety of electronic components. Power is supplied from the battery 2046 through the cable 2045 to the display portion 2047 and the electronic components in the housing 2042. A variety of information such as an image transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, biological information on the user is obtained with a biosensor, and the information is stored in the memory device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 17A:
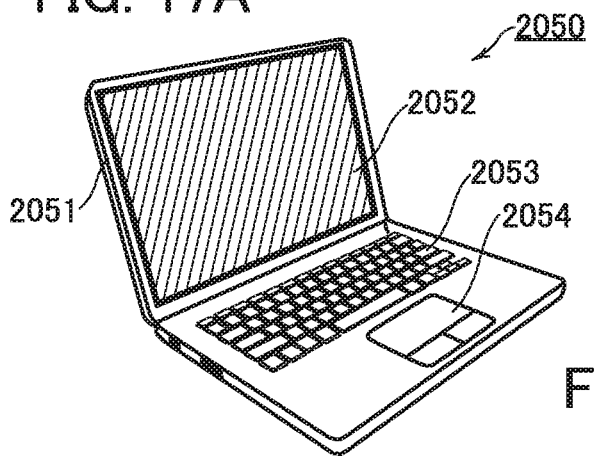
FIG. 17 Diagrams each illustrating a structure example of an electronic device.

A laptop PC (personal computer) 2050 illustrated in FIG. 17(A) includes a housing 2051, a display portion 2052, a keyboard 2053, and a pointing device 2054. The laptop PC 2050 can be operated by touch operation on the display portion 2052.

Figure 17B:
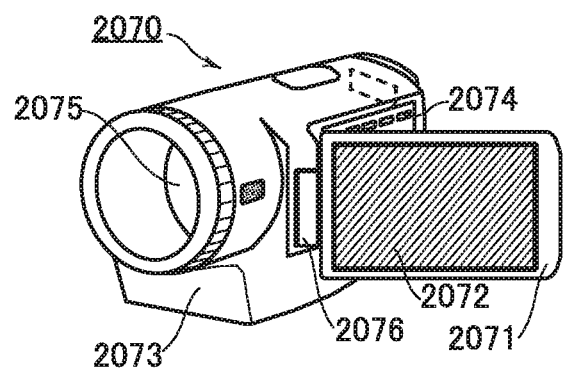

A video camera 2070 illustrated in FIG. 17(B) includes a housing 2071, a display portion 2072, a housing 2073, an operation key 2074, a lens 2075, and a joint 2076. The display portion 2072 is provided in the housing 2071, and the operation key 2074 and the lens 2075 are provided in the housing 2073. The housing 2071 and the housing 2073 are connected to each other with the joint 2076, and the angle between the housing 2071 and the housing 2073 can be changed with the joint 2076. A structure in which images on the display portion 2072 are changed in accordance with the angle between the housing 2071 and the housing 2073 at the joint 2076 may be employed. Various operations such as an operation of starting and stopping video recording, magnification and zoom adjustment, and changing a shooting range can be performed by touch operation on the display portion 2072.

Figure 17C:
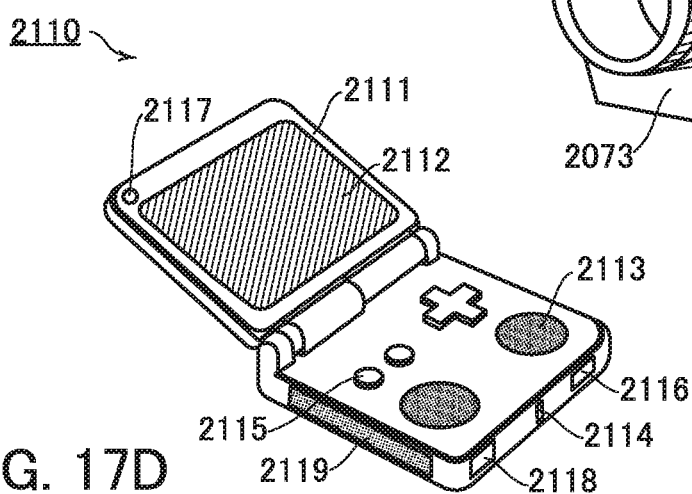

A portable game machine 2110 illustrated in FIG. 17(C) includes a housing 2111, a display portion 2112, speakers 2113, an LED lamp 2114, operation key buttons 2115, a connection terminal 2116, a camera 2117, a microphone 2118, and a recording medium read portion 2119.

Figure 17D:
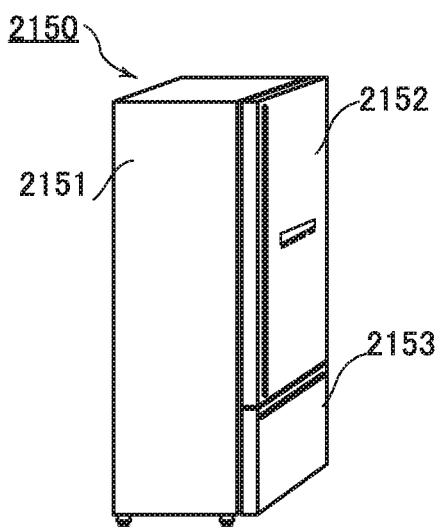

An electric refrigerator-freezer 2150 illustrated in FIG. 17(D) includes a housing 2151, a refrigerator door 2152, a freezer door 2153, and the like.

Figure 17E:
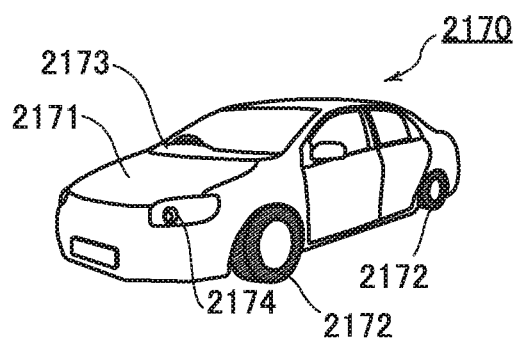

A motor vehicle 2170 illustrated in FIG. 17(E) includes a car body 2171, wheels 2172, a dashboard 2173, lights 2174, and the like.

REFERENCE NUMERALS a1 terminal
a2 terminal
a3 terminal
C61 capacitor
C62 capacitor
C63 capacitor
C64 capacitor
C65 capacitor
C66 capacitor
CA1 capacitor
CA2 capacitor
CA3 capacitor
CA4 capacitor
CK1_cp signal
CK_1 LS signal
CKB1_cp signal
CL1 signal
CL2 signal
FE1 transistor
FE2 transistor
FE3 transistor
FE4 transistor
INV1 inverter
INV2 inverter
INV3 inverter
LK1 terminal
M1 transistor
M1_Q transistor
M1_QB transistor
M2_A transistor
M2_B transistor
M3 transistor
M4 transistor
M5 transistor
M61 transistor
M62 transistor
M63 transistor
M64 transistor
M65 transistor
M66 transistor MN61 transistor
MN62 transistor
MN63 transistor
MN64 transistor
MN65 transistor
2050 laptop PC
S1 signal
SEN terminal
SN1 node
SN2 node
t0 time
t1 time
t2 time
t3 time
Vcp1 potential
10 semiconductor device
20 comparator
30 comparator
31 comparator
32 comparator
35 comparator
36 comparator
41 control portion
42 voltage generation portion
43 voltage holding portion
44 cell array
50 voltage conversion circuit
51 comparator
52 logic circuit
56 logic circuit
57 clock generation circuit
70 inverter
71 inverter
72 inverter
73 inverter
74 inverter
75 inverter
76 inverter
77 inverter
78 inverter
79 inverter
80a charge pump
150 negative potential generation circuit
160 charge pump
161 charge pump
162 charge pump
163 charge pump
170 clock buffer circuit
171 clock buffer circuit
172 LS
300 semiconductor device
2010 information terminal
2011 housing
2012 display portion
2013 operation button
2014 external connection port
2015 speaker
2016 microphone
2020 wireless signal
2021 wireless signal
2030 information terminal
2031 housing
2032 display portion
2033 winding crown
2034 belt
2035 sensing unit
2040 information terminal
2041 mounting portion
2042 housing
2045 cable
2046 battery
2047 display portion
2051 housing
2052 display portion
2053 keyboard
2054 pointing device
2070 video camera
2071 housing
2072 display portion
2073 housing
2074 operation key
2075 lens
2076 joint
2110 portable game machine
2111 housing
2112 display portion
2113 speaker
2114 LED lamp
2115 operation key buttons
2116 connection terminal
2117 camera
2118 microphone
2119 recording medium read portion
2150 electric refrigerator-freezer
2151 housing
2152 refrigerator door
2153 freezer door
2170 motor vehicle
2171 car body
2172 wheel
2173 dashboard
2174 light
7000 electronic component
7001 lead
7002 printed circuit board
7004 circuit board
7100 semiconductor wafer
7102 circuit region
7104 separation region
7106 separation line
7110 chip

The invention claimed is:
1. A semiconductor device comprising:
a voltage conversion circuit;
a comparator;
a logic circuit;
a transistor; and
a capacitor,
wherein the voltage conversion circuit is configured to output, as a second signal, a signal obtained by conversion of a voltage of an input first signal in response to a clock signal output from the logic circuit,
wherein the comparator is controlled to be supplied with or not supplied with a power supply voltage in response to a power gating signal,
wherein the transistor holds an output voltage of the comparator in the capacitor in a period during which the transistor is in an off state,
wherein the logic circuit is configured to switch between supply and stop of the clock signal on the basis of a voltage held in the capacitor in a period during which the power supply voltage to the comparator is stopped, wherein an output of the comparator is electrically connected to one of a source and a drain of the transistor, and wherein the other of the source and the drain of the transistor is electrically connected to one electrode of the capacitor and to an input of the logic circuit.

2. The semiconductor device according to claim 1, wherein the transistor comprises an oxide semiconductor in a channel formation region.

3. The semiconductor device according to claim 1, wherein the comparator is supplied with the power supply voltage in a period during which the transistor is in an on state.

4. A method for driving the semiconductor device according to claim 1, wherein switching from an off state to an on state of the transistor is performed before switching from a state of stopping the power supply voltage to the comparator to a state of supplying the power supply voltage to the comparator.

5. The semiconductor device according to claim 2, wherein the comparator is supplied with the power supply voltage in a period during which the transistor is in an on state.

6. A method for driving the semiconductor device according to claim 2, wherein switching from an off state to an on state of the transistor is performed before switching from a state of stopping the power supply voltage to the comparator to a state of supplying the power supply voltage to the comparator.

* * * * *